(12) United States Patent
Shi et al.

(10) Patent No.: US 11,818,935 B2
(45) Date of Patent: Nov. 14, 2023

(54) DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Ling Shi, Beijing (CN); Ke Liu, Beijing (CN); Yipeng Chen, Beijing (CN); Zhenhua Zhang, Beijing (CN)

(73) Assignees: Chengdu Boe Optoelectronics Technology Co., LTD., Sichuan (CN); Boe Technology Group Co., LTD, Beijing (CN)

( * ) Notice: Subject to any disclaimer, the term of this patent is extended or adjusted under 35 U.S.C. 154(b) by 0 days.

(21) Appl. No.: 17/800,923

(22) PCT Filed: Aug. 13, 2021

(86) PCT No.: PCT/CN2021/112420
§ 371 (c)(1),
(2) Date: Aug. 19, 2022

(87) PCT Pub. No.: WO2022/062760
PCT Pub. Date: Mar. 31, 2022

(65) Prior Publication Data
US 2023/0081009 A1    Mar. 16, 2023

(30) Foreign Application Priority Data
Sep. 25, 2020    (CN) .......................... 202011026191.0

(51) Int. Cl.
G09G 3/32       (2016.01)
H10K 59/35      (2023.01)
(Continued)

(52) U.S. Cl.
CPC ......... *H10K 59/353* (2023.02); *G09G 3/3216* (2013.01); *G09G 3/3225* (2013.01);
(Continued)

(58) Field of Classification Search
CPC ............... G09G 3/3225; G09G 3/3208; G09G 2300/0413; G09G 2300/0426;
(Continued)

(56) References Cited

U.S. PATENT DOCUMENTS 10,460,656 B2   10/2019  Xi et al.
2014/0117336 A1  5/2014  Kim et al.
(Continued)

FOREIGN PATENT DOCUMENTS

CN      108682375 A     10/2018
CN      109584717 A      4/2019
(Continued)

*Primary Examiner* — Pegeman Karimi
(74) *Attorney, Agent, or Firm* — IP & T GROUP LLP

(57) ABSTRACT

A display panel includes a substrate, first light-emitting devices located in a first display area, a first driving circuit, second light-emitting devices located in a second display area, and a second driving circuit. The first driving circuit is configured to actively drive the first light-emitting devices to emit light, and includes a plurality of pixel driving circuits and a signal line. The signal line is located in the second display area, and extends along an edge of the second display area. An orthographic projection of the signal line on the substrate and an orthogonal projection of the first display area on the substrate have a gap therebetween. The second driving circuit is configured to passively drive the second light-emitting devices to emit light. An orthographic projection of at least one of the second light-emitting devices on the substrate is overlapped with an orthogonal projection of the gap on the substrate.

19 Claims, 14 Drawing Sheets

(51) Int. Cl.
*H10K 59/131* (2023.01)
*H10K 59/179* (2023.01)
*G09G 3/3216* (2016.01)
*G09G 3/3225* (2016.01)

(52) U.S. Cl.
CPC ......... *H10K 59/131* (2023.02); *H10K 59/179* (2023.02); *H10K 59/351* (2023.02); *H10K 59/352* (2023.02); *G09G 2300/0426* (2013.01); *G09G 2300/0452* (2013.01)

(58) Field of Classification Search
CPC ... G09G 2300/0819; G09G 2310/0232; G09G 2310/0267; G09G 2310/0281; G09G 2310/0283; G09G 2310/0286; G09G 3/3216; G09G 2300/0452; H10K 59/12; H10K 59/353; H10K 59/131; H10K 59/179; H10K 59/351; H10K 59/352
See application file for complete search history.

(56) References Cited

U.S. PATENT DOCUMENTS

| | | | | |
|---|---|---|---|---|
| 2018/0308417 | A1* | 10/2018 | Xie | G09G 3/3266 |
| 2018/0330671 | A1* | 11/2018 | Kim | G09G 3/3266 |
| 2019/0355795 | A1* | 11/2019 | Liu | G09G 3/3225 |
| 2020/0312832 | A1* | 10/2020 | Chi | H10K 59/353 |
| 2022/0085328 | A1* | 3/2022 | Kang | H10K 50/844 |

FOREIGN PATENT DOCUMENTS

| | | |
|---|---|---|
| CN | 109697953 A | 4/2019 |
| CN | 110767681 A | 2/2020 |
| CN | 110767685 A | 2/2020 |
| CN | 210516183 U | 5/2020 |

* cited by examiner

1123

— Vinit

— $C_2$

— Vinit

DISPLAY PANEL AND DISPLAY DEVICE

CROSS-REFERENCE TO RELATED APPLICATIONS

This application is a national phase entry under 35 USC 371 of International Patent Application No. PCT/CN 2021/112420 filed on Aug. 13, 2021, which claims priority to Chinese Patent Application No. 202011026191.0, filed on Sep. 25, 2020, which are incorporated herein by reference in their entirety.

TECHNICAL FIELD

The present disclosure relates to the field of display technologies, and in particular, to a display panel and a display device.

BACKGROUND

Organic light-emitting diodes (OLEDs) are also referred to as organic electroluminescent displays or organic light-emitting semiconductors. OLEDs may be used in a display device to manufacture an OLED display device. OLED display devices are considered to be the mainstream development direction of next-generation display devices due to their excellent characteristics of self-luminescence, no backlight, high contrast, small thickness, wide viewing angle, fast response speed, ability to be used in flexible panels, wide operating temperature range, and simple structure and process.

SUMMARY

In an aspect, a display panel is provided. The display panel has a first display area and a second display area that are adjacent to each other. The display panel includes a substrate, a plurality of first light-emitting devices, a first driving circuit, a plurality of second light-emitting devices and a second driving circuit. The plurality of first light-emitting devices are disposed on the substrate and located in the first display area. The first driving circuit is disposed on the substrate, and is coupled to the plurality of first light-emitting devices. The first driving circuit is configured to actively drive the plurality of first light-emitting devices to emit light. The first driving circuit includes a plurality of pixel driving circuits and a signal line. The signal line is located in the second display area, and extends substantially along an edge of the second display area proximate to the first display area. The signal line is coupled to pixel driving circuits located on two opposite sides of the second display area, and an orthographic projection of the signal line on the substrate and an orthogonal projection of the first display area on the substrate have a gap therebetween. The plurality of second light-emitting devices are disposed on the substrate and located in the second display area. The second driving circuit is disposed on the substrate, and is coupled to the plurality of second light-emitting devices. The second driving circuit is configured to passively drive the plurality of second light-emitting devices to emit light. An orthographic projection of at least one of the plurality of second light-emitting devices on the substrate is overlapped with an orthogonal projection of the gap on the substrate.

In some embodiments, the first display area includes a first sub-area and two second sub-areas arranged opposite to each other along a first direction, and the second sub-areas are located between the first sub-area and the second display area. A length of a second sub-area is substantially equal to a length of the second display area. A length direction of the second sub-area is a second direction, and the second direction is perpendicular to the first direction.

Along the first direction, a minimum distance in distances each of which is a distance between any two first light-emitting devices located in the first sub-area is less than a minimum distance in distances each of which is a distance between any two first light-emitting devices located in the second sub-area.

In some embodiments, along the first direction, first light-emitting devices located in the first sub-area are arranged at equal distances, and distances each of which is a distance between adjacent first light-emitting devices located in the second sub-area are increased in sequence.

In some embodiments, an orthographic projection, on the substrate, of a pixel driving circuit in the plurality of pixel driving circuits that is coupled to a first light-emitting device proximate to the second display area is overlapped with the orthogonal projection of the gap on the substrate.

In some embodiments, in the first display area, the plurality of first light-emitting devices constitute a plurality of first display units and a plurality of second display units, and the plurality of second display units are closer to the second display area than the plurality of first display units. A first display unit and a second display unit each include first light-emitting devices with light-emitting colors of three primary colors. A light-emitting color of each first light-emitting device is one of the three primary colors. The first display unit includes four first light-emitting devices, and the second display unit includes three first light-emitting devices.

In some embodiments, at least one orthographic projection, on the substrate, of at least one pixel driving circuit respectively coupled to at least one first light-emitting device in the second display unit is overlapped with the orthographic projection of the gap on the substrate.

In some embodiments, an orthographic projection, on the substrate, of a first light-emitting device in the at least one first light-emitting device that is coupled to a pixel driving circuit in the at least one pixel driving circuit, whose orthographic projection on the substrate is overlapped with the orthogonal projection of the gap on the substrate, is non-overlapped with the orthographic projection of this pixel driving circuit on the substrate.

In some embodiments, in the second display area, the plurality of second light-emitting devices constitute a plurality of third display units each including second light-emitting devices with light-emitting colors of the three primary colors. A light-emitting color of each second light-emitting device is one of the three primary colors, and a number of the second light-emitting devices included in each third display unit is equal to a number of the first light-emitting devices included in the second display unit.

In some embodiments, the first light-emitting device includes a first electrode and a second electrode arranged opposite to each other, and second electrodes in the plurality of first light-emitting devices are of an integrative structure.

The second light-emitting device includes a third electrode and a fourth electrode arranged opposite to each other, and fourth electrodes in second light-emitting devices in a same column of third display units are of an integrative structure.

The first electrode and the third electrode are arranged in a same layer, and are made of a same material. The second electrode and the fourth electrode are arranged in a same layer, and are made of a same material.

In some embodiments, the display panel further includes a plurality of separating structures disposed in the second display area. The separating structures are configured to separate a second electrode and a fourth electrode that are adjacent to each other, and to separate two adjacent fourth electrodes.

In some embodiments, in a case where at least one orthographic projection, on the substrate, of at least one pixel driving circuit respectively coupled to at least one first light-emitting device in the second display unit is overlapped with the orthogonal projection of the gap on the substrate, the separating structure includes a plurality of protrusion each protruding along a direction from the first display area to the second display area.

In some embodiments, a separating structure in the plurality of separating structures is a separating pillar or a separating groove.

In some embodiments, in a longitudinal section of the separating pillar or the separating groove, a length of a bottom edge is less than a length of a top edge. The longitudinal section is taken along the direction from the first display area to the second display area.

In some embodiments, a minimum distance in distances each of which is a distance between any adjacent first light-emitting device and second light-emitting device is less than or equal to 60 μm.

In some embodiments, the first driving circuit further includes initialization signal lines, and the signal line is connected to initialization signal lines located on the two opposite sides of the second display area. The two opposite sides of the second display area are two opposite sides distributed along an extending direction of the initialization signal lines.

In some embodiments, the first driving circuit further includes scan signal lines configured to provide scan signals to the plurality of pixel driving circuits, and the scan signal lines extend along a first direction. The first direction is a direction along which the two opposite sides of the second display area are distributed.

In some embodiments, the display panel further includes a first drive module and a second drive module. The first drive module is configured to provide a driving signal to the first driving circuit, and the second drive module is configured to provide another driving signal to the second driving circuit.

In another aspect, a display device is provided. The display device includes the display panel in any one of the above embodiments.

In some embodiments, an orthographic projection, on the substrate, of a separating structure configured to separate the second electrode and the fourth electrode that are adjacent to each other is overlapped with the orthogonal projection of the gap on the substrate.

DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal involved in the embodiments of the present disclosure.

DETAILED DESCRIPTION

Figure 1A:
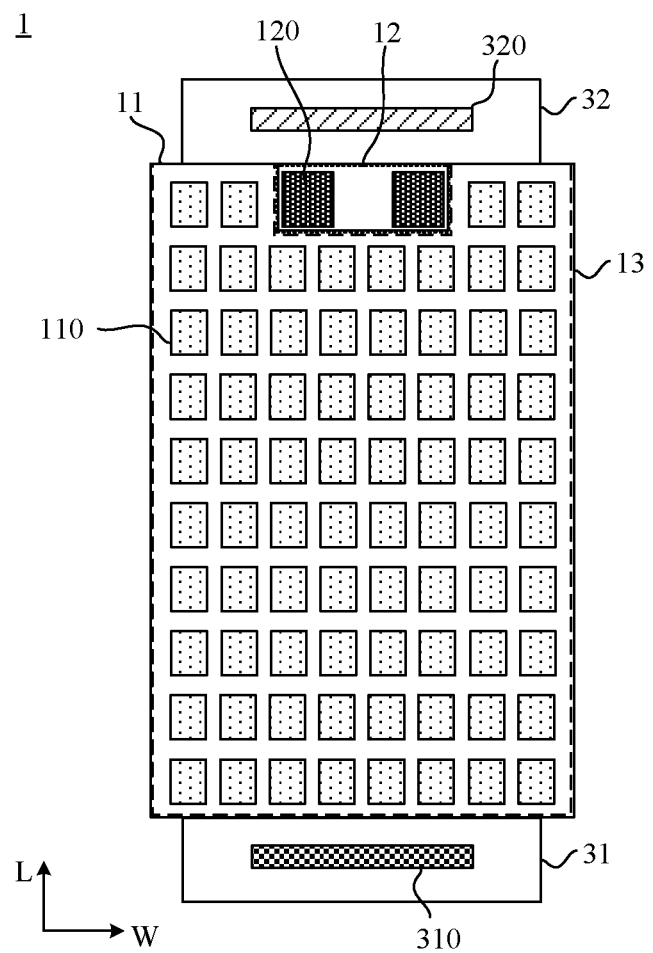
FIG. 1A is a top view of a display panel, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms such as "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

As used herein, the term "if" is, optionally, construed to mean "when" or "in a case where" or "in response to determining" or "in response to detecting", depending on the context. Similarly, the phrase "if it is determined" or "if [a stated condition or event] is detected" is, optionally, construed to mean "in a case where it is determined" or "in response to determining" or "in a case where [the stated condition or event] is detected" or "in response to detecting [the stated condition or event]", depending on the context.

The use of the phase "applicable to" or "configured to" herein means an open and inclusive expression, which does not exclude devices that are applicable to or configured to perform additional tasks or steps.

In addition, the use of the phase "based on" means openness and inclusiveness, since a process, step, calculation or other action that is "based on" one or more stated conditions or values may, in practice, be based on additional conditions or values exceeding those stated.

As used herein, the term such as "about," "approximately" or "substantially" includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

As used herein, the term "same layer" means that specific patterns in a layer structure are formed by a same evaporation process or a same patterning process. Depending on different specific patterns, the same patterning process may include several exposure, development or etching processes. Moreover, the specific patterns in the layer structure formed by the evaporation process or the patterning process may be continuous or discontinuous, and these specific patterns may also be at different heights or have different thicknesses.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Embodiments of the present disclosure provide a display device. The display device is, for example, an OLED display device. The display device includes, for example, a display panel and a sensor. The sensor is, for example, a camera or an earpiece, and the sensor is installed on a non-light exit side of the display panel that is opposite to a light exit side. The light exit side is a display side of the display panel. In some embodiments, the light exit side is a side of the display panel where a cover plate is located.

Figure 1B:
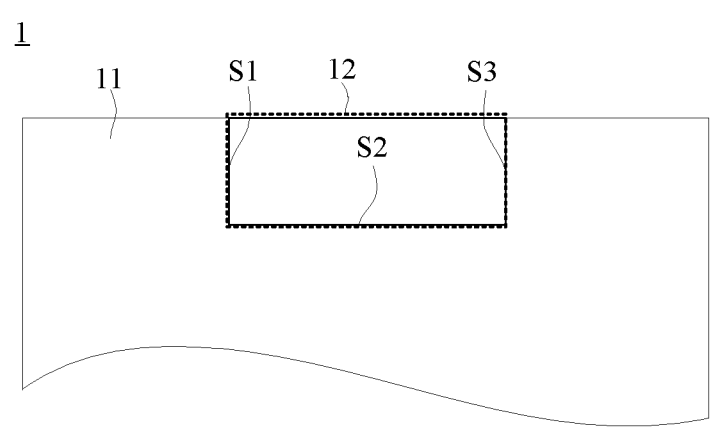
FIG. 1B is a top view of another display panel, in accordance with some embodiments of the present disclosure.

For example, referring to FIGS. 1A and 1B, a display area of the display panel 1 includes a first display area 11 and a second display area 12, and at least three sides of the second display area 12 are adjacent to the first display area 11. Referring to FIG. 1B, the at least three sides of the second display area 12 includes, for example, a first side S1, a second side S2 and a third side S3, and the first side S1 and the third side S3 are arranged opposite to each other. The second display area 12 is configured to install the sensor. That is, the sensor is installed on a non-light exit side of the second display area 12.

In a case where a camera is installed on the non-light exit side of the second display area 12, this camera may be referred to as an under-screen camera. The under-screen camera takes advantage of the self-luminescence of the OLED display device and the transparency of the display panel 1. In the second display area 12, when the OLED display device does not perform a photographing function, the second display area 12 may normally display contents on a screen. When the OLED display device performs the photographing function, the second display area 12 is in a transparent state, so that external ambient light may pass through the display panel 1 and reach the camera, so as to realize the photographing function.

Based on the above, referring to FIG. 1A, the display panel 1 includes a substrate 13, a plurality of first light-emitting devices 110, a first driving circuit, a plurality of second light-emitting devices 120 and a second driving circuit.

The substrate is, for example, a glass substrate or a flexible substrate. The flexible substrate is made of, for example, polyimide (PI).

The plurality of first light-emitting devices 110 are disposed on the substrate, and are located in the first display area 11.

The first light-emitting device 110 is, for example, an OLED light-emitting device. Referring to FIG. 10, the first light-emitting device 110 includes, for example, a first electrode 1101 and a second electrode 1102 arranged opposite to each other, and a first light-emitting functional pattern 1103 located between the first electrode 1101 and the second electrode 1102.

The first electrode 1101 is made of a transparent conductive material, such as indium tin oxide (ITO). The second electrode 1102 is made of, for example, metal, such as argentum (Ag) or aluminum (Al). The second electrode 1102 is, for example, a semi-transparent electrode.

The first light-emitting functional pattern 1103 includes at least a light-emitting pattern 1104. The light-emitting pattern 1104 is made of an organic light-emitting material, such as a fluorescent material. The first light-emitting functional pattern 1103 may further include one or more of an electron transport pattern 1105, an electron injection pattern 1106, a hole transport pattern 1107 and a hole injection pattern 1108. FIG. 10 only illustrates a case that the first light-emitting functional pattern 1103 includes the light-emitting pattern 1104, the electron transport pattern 1105, the electron injection pattern 1106, the hole transport pattern 1107 and the hole injection pattern 1108, which does not thus limit the structure of the first light-emitting functional pattern 1103.

Figure 1C:
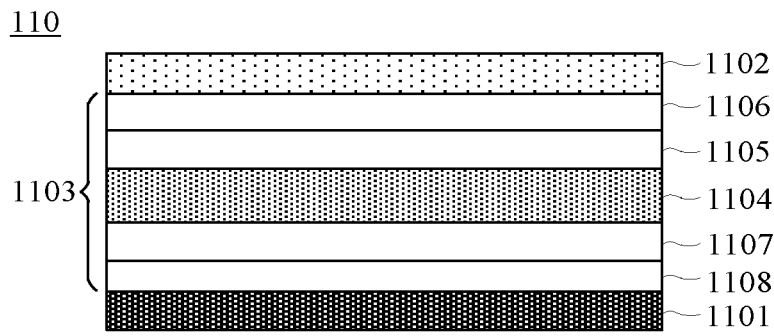
FIG. 1C is a longitudinal sectional view of a first light-emitting device taken along a first direction, in accordance with some embodiments of the present disclosure.
Figure 1D:
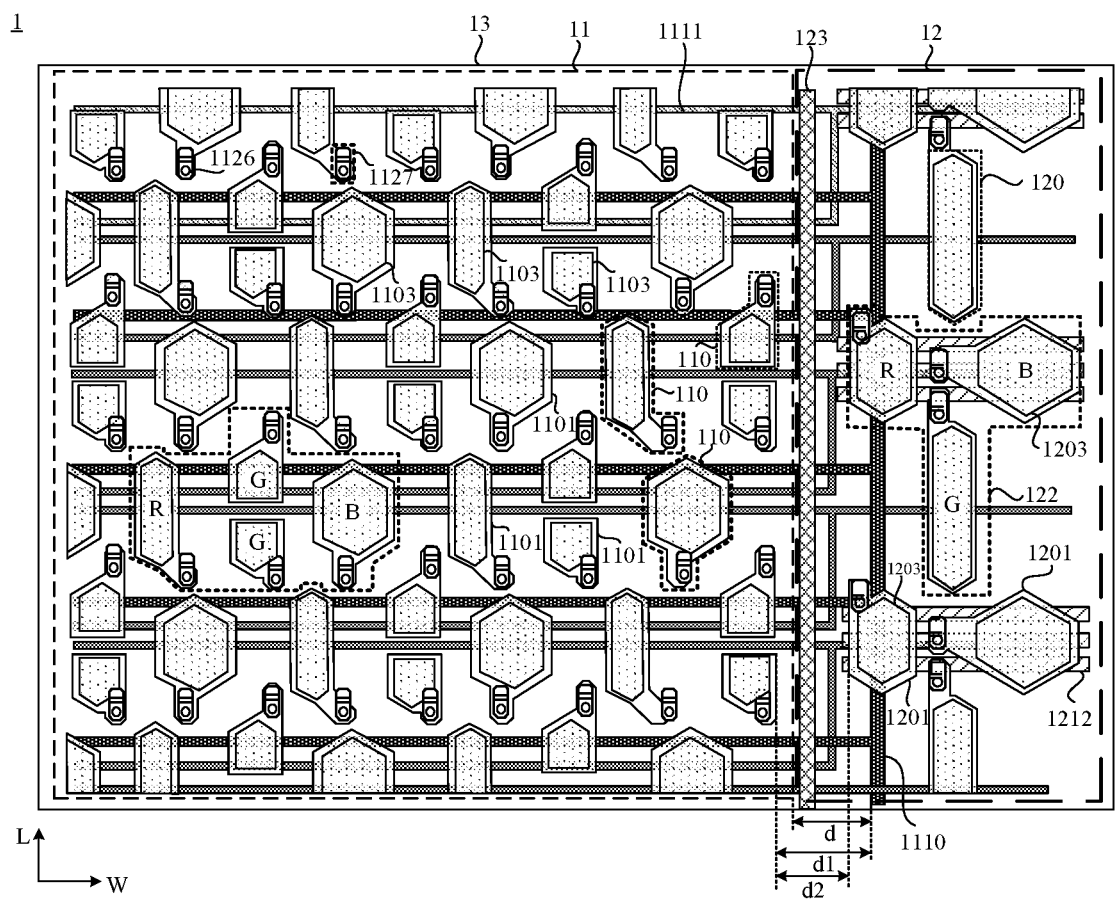
FIG. 1D is a top view of yet another display panel, in accordance with some embodiments of the present disclosure.
Figure 1E:
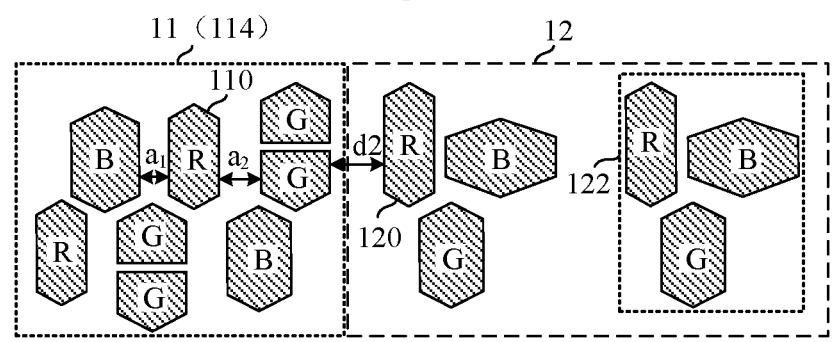
FIG. 1E is a top view showing a distribution of first light-emitting devices and second light-emitting devices, in accordance with some embodiments of the present disclosure.
Figure 1F:
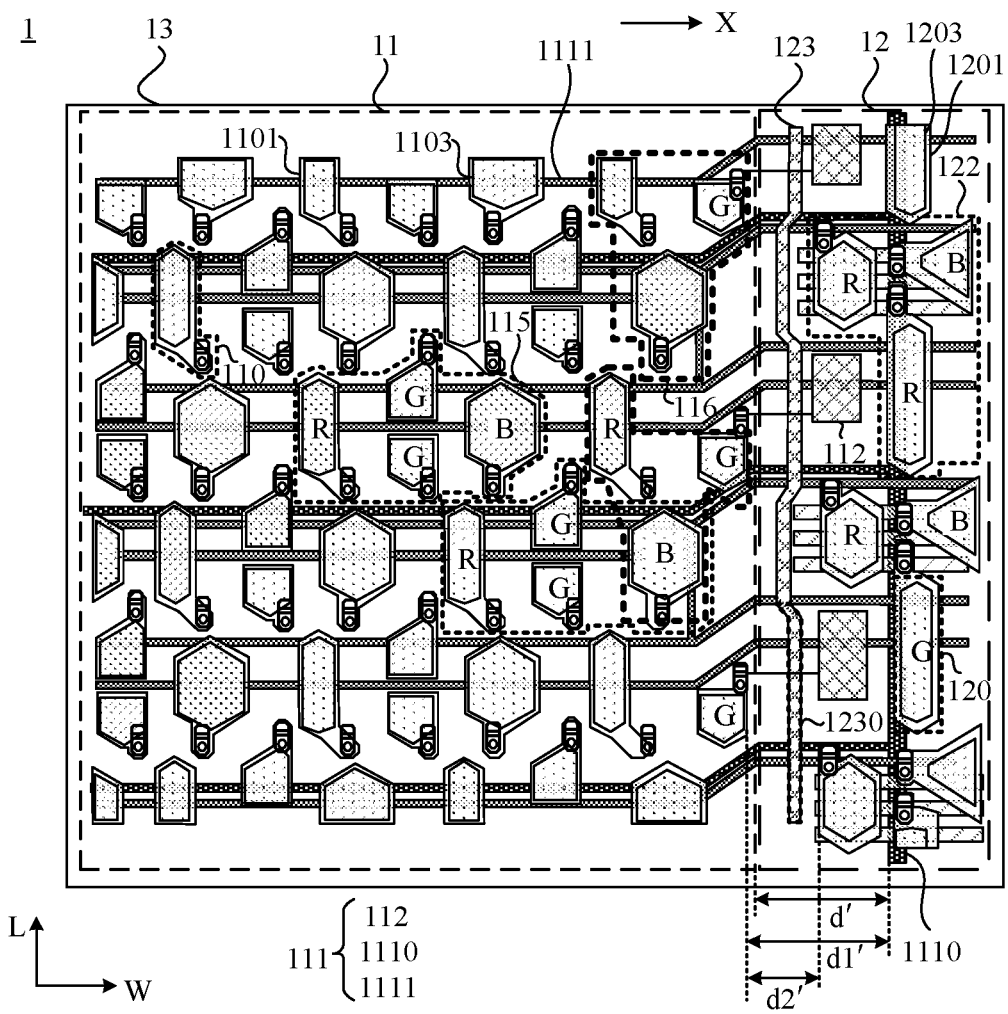
FIG. 1F is a top view of yet another display panel, in accordance with some embodiments of the present disclosure.

Referring to FIGS. 1D and 1F, the first driving circuit 111 is disposed on the substrate 13. The first driving circuit 111 is coupled to the plurality of first light-emitting devices 110, and is configured to actively drive the plurality of first light-emitting devices 110 to emit light. The first driving circuit 111 includes a plurality of pixel driving circuits 112 and a signal line 1110. The signal line 1110 is located in the second display area 12, and extends substantially along an edge of the second display area 12 proximate to the first display area 11. The signal line 1110 is configured to be coupled to pixel driving circuits located on two opposite sides of the second display area 12. Moreover, an orthographic projection of the signal line 1110 on the substrate 13 and an orthogonal projection of the first display area 11 on the substrate 13 have a gap therebetween.

Referring to FIGS. 1D and 1F, the signal line 1110 is located outside the first display area 11, and is located in the second display area 12. The orthographic projection of the signal line 1110 on the substrate 13 and the orthogonal projection of the first display area 11 on the substrate 13 have the gap therebetween. Referring to FIG. 1D, a width, along a first direction W, of the gap between the orthographic projection of the signal line 1110 on the substrate 13 and the orthogonal projection of the first display area 11 on the substrate 13 is, for example, d. Referring to FIG. 1F, the width of the gap between the orthographic projection of the signal line 1110 on the substrate 13 and the orthogonal projection of the first display area 11 on the substrate 13 is, for example, d', and d' is greater than d (i.e., d'>d).

Figure 1G:
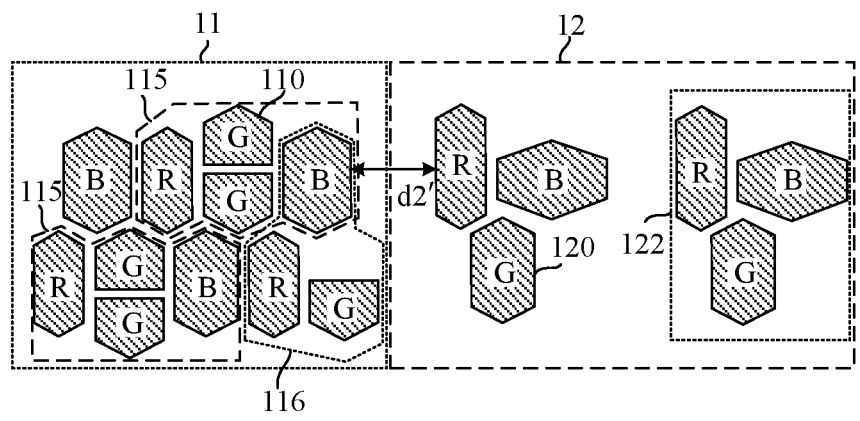
FIG. 1G is a top view showing another distribution of first light-emitting devices and second light-emitting devices, in accordance with some embodiments of the present disclosure.
Figure 1H:
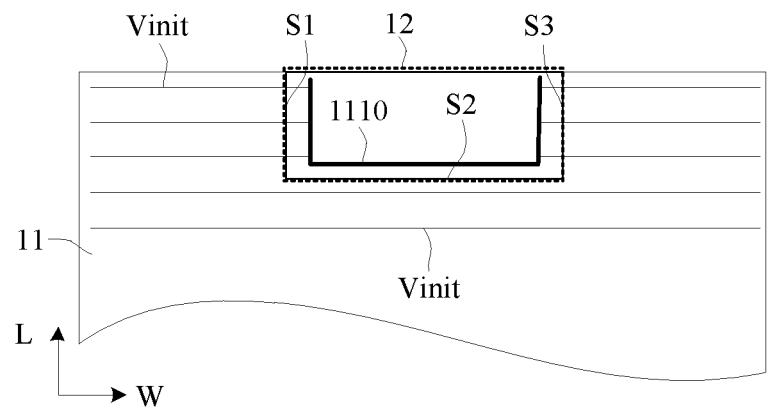
FIG. 1H is a top view showing a coupling structure of a signal line and initialization signal lines, in accordance with some embodiments of the present disclosure.

Referring to FIG. 1H, the signal line 1110 extends substantially along the edge of the second display area 12 proximate to the first display area 11. For example, the signal line 1110 extends along the first side S1, the second side S2 and the third side S3. The signal line 1110 is configured to be coupled to the pixel driving circuits located on the two opposite sides (e.g., the first side S1 and the third side S3) of the second display area 12, so as to provide a same signal to these pixel driving circuits, and this signal is, for example, an initialization signal Vinit".

Referring to FIG. 1H, the first driving circuit 111 further includes initialization signal lines Vinit extending laterally. The signal line 1110 is coupled to initialization signal lines Vinit located on the two opposite sides of the second display area 12. The two opposite sides of the second display area 12 are two opposite sides of the second display area 12 distributed along an extending direction of the initialization signal lines Vinit.

Referring to FIG. 1H, the two opposite sides of the second display area 12 are two opposite sides distributed along the first direction W.

In the pixel driving circuits located on the two opposite sides of the second display area 12, pixel driving circuits in each row are coupled to two initialization signal lines Vinit. Part of the pixel driving circuits in each row are located on a side in the two opposite sides of the second display area 12, and are coupled to an initialization signal line Vinit, and another part of the pixel driving circuits in each row are coupled to another initialization signal line Vinit. The signal line 1110 is coupled to the initialization signal lines Vinit located on the two opposite sides of the second display area 12, so that the coupling relationship is simple, and the initialization signal lines Vinit located on the two opposite sides of the second display area 12 are ensured to have the same signal, which ensures that the pixel driving circuits that are coupled to the initialization signal lines Vinit located on the two opposite sides of the second display area 12 receive the same initialization signal Vinit". Therefore, the signal line 1110 is coupled to the pixel driving circuits located on the two opposite sides of the second display area 12 through the initialization signal lines Vinit located on the two opposite sides of the second display area 12.

Since all the pixel driving circuits 112 in the display panel 1 receive the same initialization signal, initialization signal lines in different rows may be coupled together. Since a light transmittance of the second display area 12 needs to be ensured, and the signal line 1110 is made of a metal material, the initialization signal lines Vinit located on the two opposite sides of the second display area 12 are arranged to be coupled together by the same signal line 1110, so that the number of signal lines 1110 is reduced. Thus, an area occupied by the signal line 1110 in the second display area 12 is reduced, which ensures a high light transmittance of the second display area 12, and is conducive to providing more space for installing the sensor on the non-light exit side of the second display area 12.

It will be understood by those skilled in the art that since the signal line 1110 is coupled to the initialization signal lines Vinit, a signal transmitted by the signal line 1110 is the initialization signal Vinit".

Figure 2A:
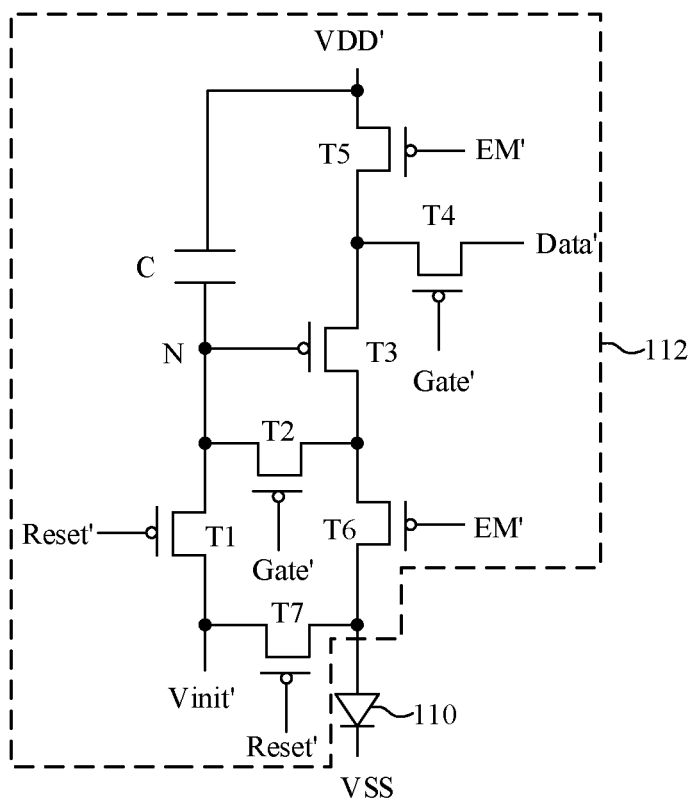
FIG. 2A is an equivalent circuit diagram of a pixel driving circuit and a first light-emitting device, in accordance with some embodiments of the present disclosure.

For example, referring to FIG. 2A, FIG. 2A is an equivalent circuit diagram of a pixel driving circuit 112 and a first light-emitting device 110. The pixel driving circuit 112 includes a first transistor T1, a second transistor T2, a third transistor T3, a fourth transistor T4, a fifth transistor T5, a sixth transistor T6, a seventh transistor T7 and a capacitor C. For example, the first transistor T1 to the seventh transistor T7 are all P-type thin film transistors or all N-type thin film transistors. In the embodiments of the present disclosure, the first transistor T1 to the seventh transistor T7 are all P-type thin film transistors as an example for illustration, and types of the first transistor T1 to the seventh transistor T7 are not thus limited.

A gate of the first transistor T1 is coupled to a reset signal terminal Reset', a first electrode of the first transistor T1 is coupled to an initialization signal terminal Vinit', and a second electrode of the first transistor T1 is coupled to a node N.

A gate of the second transistor T2 is coupled to a gate driving signal terminal Gate', a first electrode of the second transistor T2 is coupled to a second electrode of the third transistor T3, and a second electrode of the second transistor T2 is coupled to the node N.

A gate of the third transistor T3 is coupled to the node N, a first electrode of the third transistor T3 is coupled to a second electrode of the fourth transistor T4, and the third transistor T3 is a driving transistor.

A gate of the fourth transistor T4 is coupled to the gate driving signal terminal Gate', and a first electrode of the fourth transistor T4 is coupled to a data signal terminal Data'.

A gate of the fifth transistor T5 is coupled to a light-emitting control signal terminal EM', a first electrode of the fifth transistor T5 is coupled to a first power supply voltage signal terminal VDD', and a second electrode of the fifth transistor T5 is coupled to the first electrode of the third transistor T3.

A gate of the sixth transistor T6 is coupled to the light-emitting control signal terminal EM', a first electrode of the sixth transistor T6 is coupled to the second electrode of the third transistor T3, and a second electrode of the sixth transistor T6 is coupled to the first electrode 1101 of the first light-emitting device 110. The second electrode 1102 of the first light-emitting device 110 is coupled to a second power supply voltage signal terminal VSS. In some embodiments, a voltage signal VSS' provided by the second power supply voltage signal terminal VSS is, for example, 0 V.

A gate of the seventh transistor T7 is coupled to the reset signal terminal Reset', a first electrode of the seventh transistor T7 is coupled to the initialization signal terminal Vinit', and a second electrode of the seventh transistor T7 is coupled to the second electrode of the sixth transistor T6. The initialization signal Vinit" provided by the initialization signal terminal Vinit' is, for example, 0 V.

A first electrode plate of the capacitor C is coupled to the node N, and a second electrode plate of the capacitor C is coupled to the first power supply voltage signal terminal VDD'. A power supply voltage signal VDD" provided by the first power supply voltage signal terminal VDD' is, for example, 5 V.

For example, an operating process of the pixel driving circuit 112 includes following phases.

In a reset phase, the first transistor T1 and the seventh transistor T7 are turned on under a control of the reset signal terminal Reset. The first transistor T1 transmits the initialization signal Vinit" provided by the initialization signal terminal Vinit' to the node N, so as to reset the node N. The seventh transistor T7 transmits the initialization signal Vinit" provided by the initialization signal terminal Vinit' to the first electrode 1101 of the first light-emitting device 110, so as to reset the first electrode 1101 of the first light-emitting device 110.

In a data writing phase, the second transistor T2 and the fourth transistor T4 are turned on under a control of the gate driving signal terminal Gate'. The fourth transistor T4 transmits a first data signal Data" provided by the data signal terminal Data' to the node N through the third transistor T3 and the second transistor T2, so as to start charging the capacitor C.

In a light-emitting phase, the fifth transistor T5 and the sixth transistor T6 are turned on under a control of the light-emitting control signal terminal EM'. The fifth transistor T5 transmits the power supply voltage signal VDD" provided by the first power supply voltage signal terminal VDD' to the first electrode of the third transistor T3. Under a control of the node N and the power supply voltage signal VDD", the second electrode of the third transistor T3 outputs a driving signal to the first light-emitting device 110 through the sixth transistor T6, so as to drive the first light-emitting device 110 to emit light.

The initialization signal Vinit" received by the initialization signal terminal Vinit' is provided by the initialization signal line Vinit. For example, referring to FIG. 1H, all the initialization signal lines Vinit located on the two opposite sides of the second display area 12 are coupled to the same signal line 1110. That is, a signal transmitted by the signal line 1110 is the initialization signal Vinit". Other initialization signal lines Vinit located in the first display area 11 extend along the first direction W, and are distributed along a second direction L. The first direction W is perpendicular to the second direction L.

Figure 2B:
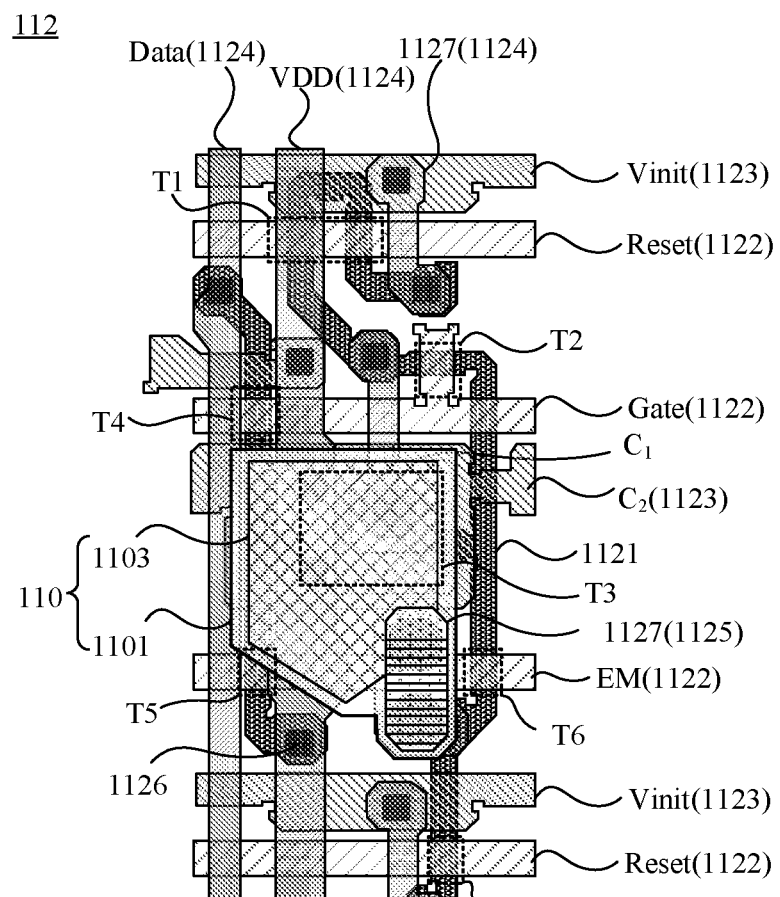
FIG. 2B is a top view showing a design structure of a pixel driving circuit, in accordance with some embodiments of the present disclosure.

Referring to FIG. 2B, FIG. 2B is a diagram showing a design structure (also referred to as lay out) of a pixel driving circuit 112. Specific structures and locations of the first transistor T1 to the seventh transistor T7 are as shown in FIG. 2B.

The second electrode of the third transistor T3 in the pixel driving circuit 112 is electrically connected to the first electrode 1101. The gate of the third transistor T3 serves as the first electrode plate $C_1$ of the capacitor C. The second electrode plate $C_2$ and the first electrode plate $C_1$ of the capacitor C are arranged opposite to each other along a thickness direction of the display panel 1. Moreover, second electrode plates $C_2$ in the plurality of pixel driving circuits 112 and the initialization signal lines Vinit are arranged in a same layer, and are made of a same material.

For example, the first transistor T1 and the second transistor T2 may be, for example, dual-gate thin film transistors, and two gates of the dual-gate thin film transistors are arranged in a same layer, and are made of a same material.

For example, referring to FIG. 2B, along the thickness direction of the display panel 1, the display panel 1 includes an active layer 1121, a first gate insulating layer, a gate metal layer 1122, a second gate insulating layer, a first metal layer 1123, an interlayer insulating layer, a second metal layer 1124, a first passivation layer, a third metal layer 1125 and a planarization layer that are away from a side of the substrate 13 in sequence. The first gate insulating layer, the second gate insulating layer, the interlayer insulating layer and the first passivation layer are all insulating layers, each of which plays an insulating role. These insulating layers are made of, for example, at least one of silicon oxide and silicon nitride. The planarization layer is made of an organic material, such as at least one of polyimide, photoresist and resin. The planarization layer plays a role of both planarizing and insulating. Since the insulating layers and the planarization layer cover the display panel 1 in their entirety, these insulating layers and the planarization layer are not shown in FIG. 2B. However, it will be understood by those skilled in the art that these insulating layers and the planarization layer are necessarily present in the display panel 1.

Figure 2C:
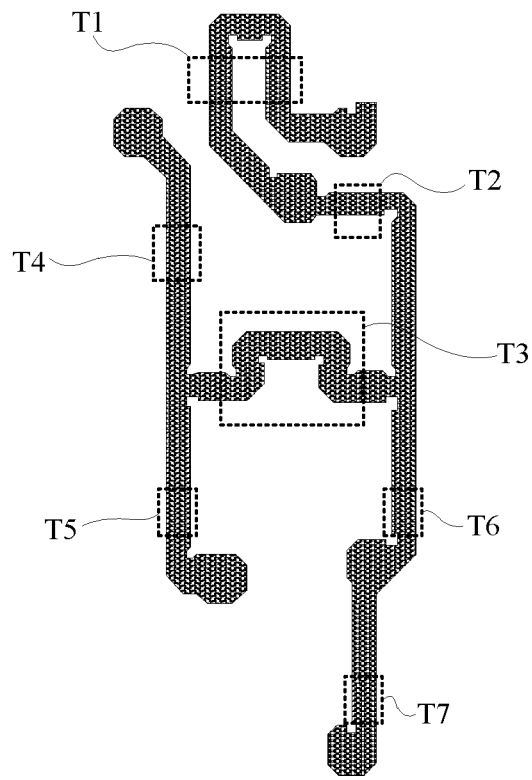
FIG. 2C is a top view of an active layer, in accordance with some embodiments of the present disclosure.

Referring to FIG. 2C, FIG. 2C is a structural diagram of the active layer 1121 for the pixel driving circuit 112. The active layer 1121 is made of, for example, any one of polysilicon (P-Si), amorphous silicon (a-Si) or an oxide. The oxide is, for example, a metal oxide such as zinc oxide (ZnO).

Figure 2D:
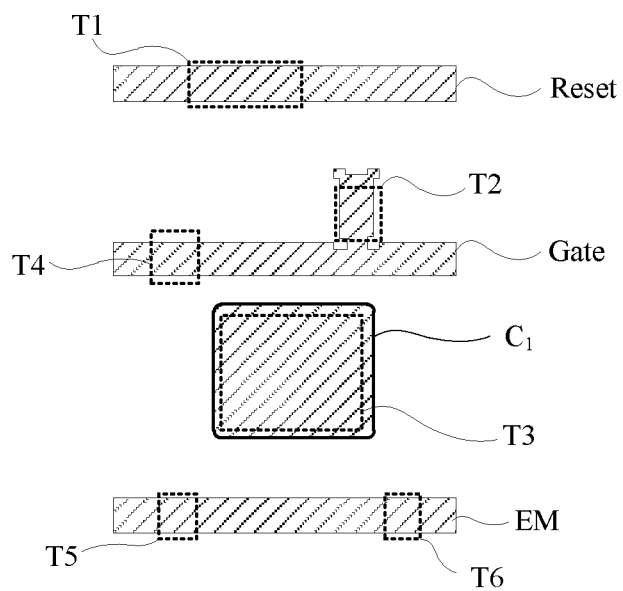
FIG. 2D is a top view of a gate metal layer, in accordance with some embodiments of the present disclosure.
Figure 2D:
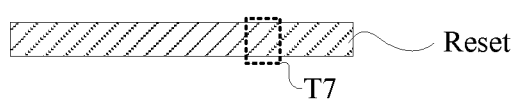

Referring to FIG. 2D, the gate metal layer 1122 is used for forming gates of thin film transistors in the plurality of pixel driving circuits 112, gate lines Gate, reset signal lines Reset and light-emitting control signal lines EM. The gate lines Gate, the reset signal lines Reset and the light-emitting control signal lines EM may also be referred to as scan signal lines 1111. The gate of the driving transistor (i.e., the third transistor T3) may serve as the first electrode plate $C_1$ of the capacitor C. The gate metal layer 1122 is made of, for example, a metal or alloy such as silver, aluminum or molybdenum.

The gate lines Gate are electrically connected to gate driving signal terminals Gate' in the plurality of pixel driving circuits 112 for providing gate driving signals Gate" to the gate driving signal terminals Gate'. The reset signal lines Reset are electrically connected to reset signal terminals Reset' in the plurality of pixel driving circuits 112 for providing reset signals Reset" to the reset signal terminals Reset'. The light-emitting control signal lines EM are electrically connected to light-emitting control signal terminal EM' in the plurality of pixel driving circuits 112 for providing light-emitting control signal EM" to the light-emitting control signal terminals EM'.

Figure 2E:
FIG. 2E is a top view of a first metal layer, in accordance with some embodiments of the present disclosure.
Figure 2E:
Figure 2E:
Figure 2E:

Referring to FIG. 2E, the first metal layer 1123 is used for forming the initialization signal lines Vinit and the second electrode plates $C_2$ of the capacitors C in the plurality of pixel driving circuits 112. The first metal layer 1123 is made of, for example, a metal or alloy such as silver, aluminum or molybdenum.

Figure 2F:
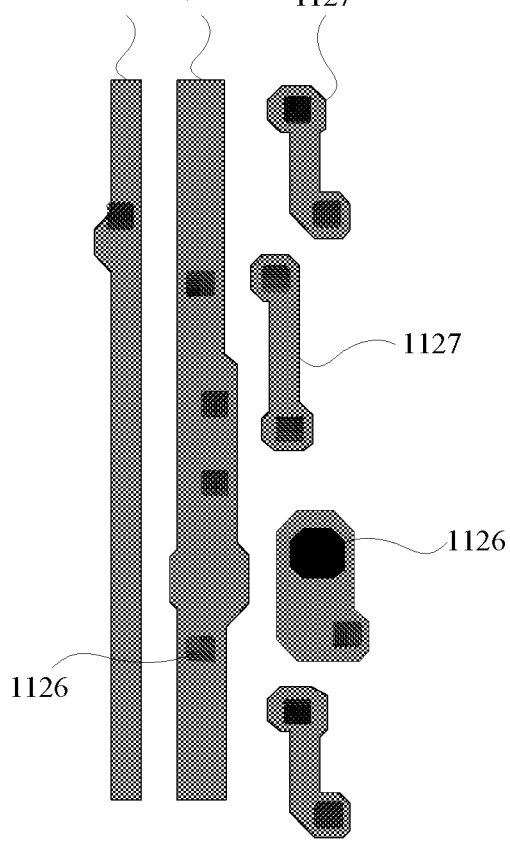
FIG. 2F is a top view of a second metal layer, in accordance with some embodiments of the present disclosure.

Referring to FIG. 2F, the second metal layer 1124 is used for forming first electrodes (e.g., sources) and second electrodes (e.g., drains) of the thin film transistors in the plurality of pixel driving circuits 112, data signal lines Data, power supply voltage signal lines VDD and connection electrodes 1127. The data signal lines Data are electrically connected to data signal terminals Data' in the plurality of pixel driving circuits 112 for providing first data signals Data" to the data signal terminals Data'. The power supply voltage signal lines VDD are electrically connected to power supply voltage signal terminals VDD' in the plurality of pixel driving circuits 112 for providing power supply voltage signals VDD" to the power supply voltage signal terminal VDD'. The connection electrode 1127 is used to electrically connect film layers (e.g., the second metal layer 1124 and the active layer 1121) that need to be electrically connected. The second metal layer 1124 is made of, for example, a metal or alloy such as silver, aluminum or molybdenum.

For example, referring to FIG. 2F, a plurality of through holes 1126 provided in the power supply voltage signal lines VDD, the data signal lines Data, and the connection electrodes 1127 are used to realize an electrical connection between each thin film transistor and the data signal line Data, an electrical connection between each thin film transistor and the power supply voltage signal line VDD, an electrical connection between each thin film transistor and the light-emitting control signal line EM, an electrical connection between each thin film transistor and the gate line Gate, and an electrical connection between each thin film transistor and the initialization signal line Vinit.

Figure 2G:
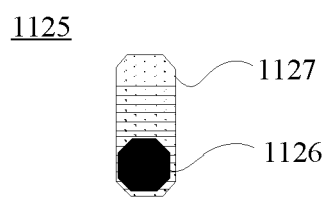
FIG. 2G is a top view of a third metal layer, in accordance with some embodiments of the present disclosure.

Referring to FIG. 2G, FIG. 2G is a structural diagram of the third metal layer 1125. A material and a function of the third metal layer 1125 are the same as the material and the function of the second metal layer 1124. For example, the third metal layer 1125 may be used for forming the first electrodes and the second electrodes of the thin film transistors, the data signal lines Data, the power supply voltage signal lines VDD and the connection electrodes 1127, so that the first electrodes and the second electrodes of the thin film transistors, the data signal lines Data, the power supply voltage signal lines VDD and the connection electrodes 1127 may be arranged in two layers, so as to increase a distance between a data signal line Data and a power supply voltage signal line VDD that are located in a same layer and adjacent to each other and reduce a parasitic capacitance generated therebetween, thereby improving an operating performance of the pixel driving circuit 112.

It will be noted that although only the connection electrode formed by the third metal layer 1125 is shown in FIG. 2G, those skilled in the art should understand that structures of the data signal lines Data and the power supply voltage signal lines VDD formed by the third metal layer 1125 are substantially the same as the structures of the data signal lines Data and the power supply voltage signal lines VDD formed by the second metal layer 1124.

Referring to FIG. 2G, the connection electrode 1127 formed by the third metal layer 1125 is configured to connect the first electrode 1101 and the second metal layer 1124, so that a signal in the second metal layer 1124 may be transmitted to the first electrode 1101.

Figure 2H:
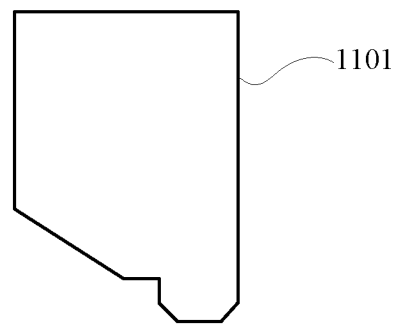
FIG. 2H is a top view of a first electrode, in accordance with some embodiments of the present disclosure.

For example, Referring to FIG. 2H, FIG. 2H is a top view of a first electrode 1101. The first electrode 1101 is a transparent electrode. Referring to FIG. 1D, in the display panel 1, first electrodes 1101 in the plurality of first light-emitting devices 110 include three types of structures. A specific shape of the first electrode 1101 is related to a light-emitting color of the first light-emitting device 110, and needs to be determined according to design requirements.

Figure 2I:
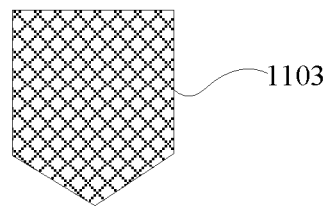
FIG. 2I is a top view of a first light-emitting functional pattern, in accordance with some embodiments of the present disclosure.

For example, Referring to FIG. 2I, FIG. 2I is a top view of a first light-emitting functional pattern 1103 of a first light-emitting device 110. Referring to FIG. 2B, along the thickness direction of the display panel 1, an orthographic projection of the first light-emitting functional pattern 1103 of the first light-emitting device 110 on the first electrode 1101 is within the first electrode 1101. It will be understood by those skilled in the art that the top view of the first light-emitting functional pattern 1103 of the first light-emitting device 110 varies with the top view of the first electrode 1101. FIGS. 2H and 2I only illustrate specific examples of the structures of the first electrode 1101 and the first light-emitting functional pattern 1103 of the first light-emitting device 110, and the specific structures of the first electrode 1101 and the first light-emitting functional pattern 1103 of the first light-emitting device 110 are not thus limited.

In some embodiments, a pixel defining layer is further provided on a side of the first electrode 1101 away from the substrate 13. A plurality of hollow regions are provided in the pixel defining layer. A hollow region exposes at least part of the first electrode 1101, and the first light-emitting functional pattern 1103 of the first light-emitting device 110 is located in the hollow region. When the display panel 1 operates, the pixel driving circuit 112 below the first light-emitting device 110 may drive the first light-emitting device 110 to emit light. The light-emitting color of the first light-emitting device 110 is any one of three primary colors, and the three primary colors are, for example, red (R), green (G) and blue (B), respectively.

Figure 3A:
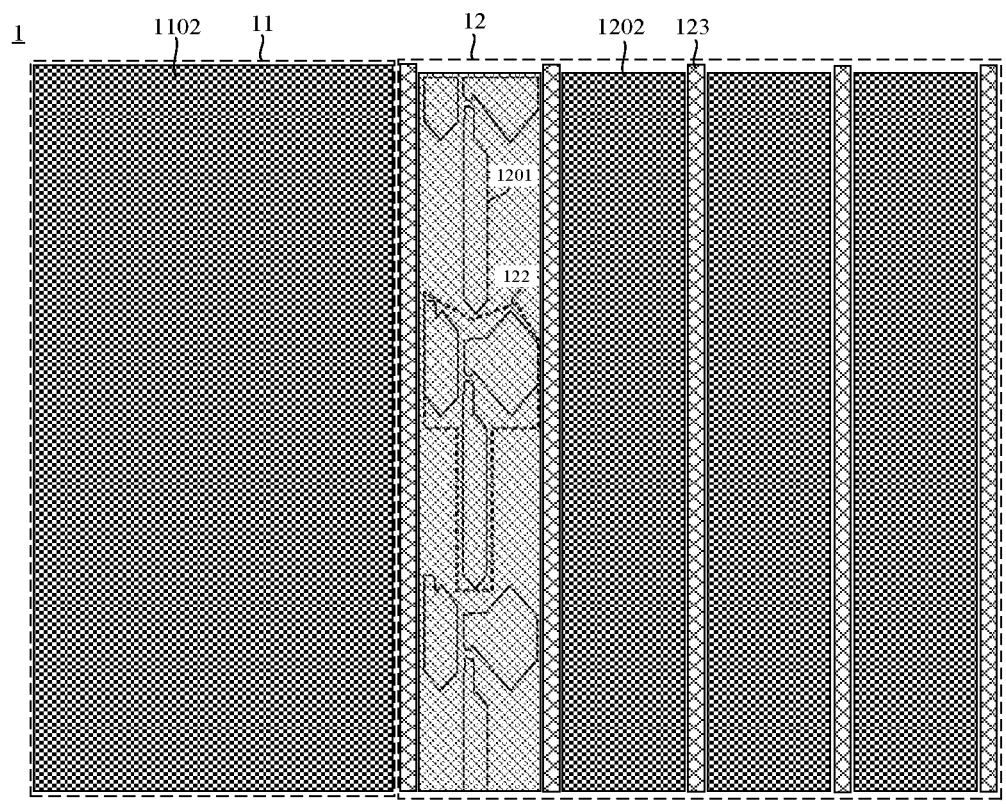
FIG. 3A is a top view of second electrodes and fourth electrodes, in accordance with some embodiments of the present disclosure.
Figure 3B:
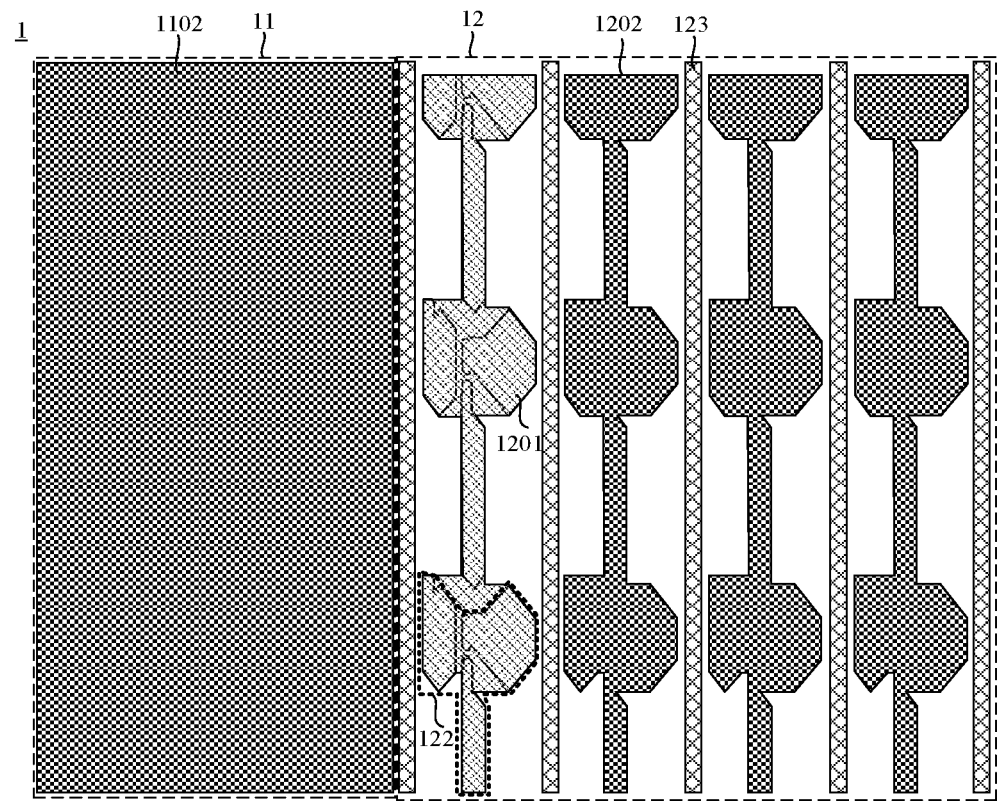
FIG. 3B is another top view of second electrodes and fourth electrodes, in accordance with some embodiments of the present disclosure.

Referring to FIG. 1D, the plurality of second light-emitting devices 120 are disposed on the substrate 13, and are located in the second display area 12. Referring to FIGS. 3A and 3B, the second light-emitting device 120 includes, for example, a third electrode 1201 and a fourth electrode 1202 arranged opposite to each other, and a second light-emitting functional pattern 1203 located between the third electrode 1201 and the fourth electrode 1202.

A structure of the second light-emitting functional pattern 1203 of the second light-emitting device 120 is the same as the structure of the first light-emitting functional pattern 1103 of the first light-emitting device 110, and thus is not repeated. Moreover, the second light-emitting functional pattern 1203 and the first light-emitting functional pattern 1103 are arranged in a same layer, and are made of a same material.

The third electrode 1201 and the first electrode 1101 are arranged in a same layer, and are made of a same material. The third electrode 1201 and the first electrode 1101 are made of, for example, a transparent conductive material, such as indium tin oxide (ITO). The first electrode 1101 and the third electrode 1201 may also be referred to as anodes.

In some embodiments, the shape of the first electrode 1101 is different from that of the third electrode 1201.

The fourth electrode and the second electrode 1102 are arranged in a same layer, and are made of a same material. The fourth electrode and the second electrode 1102 are made of, for example, a metal material, such as silver (Ag) or aluminum (Al). The fourth electrode and the second electrode 1102 may also be referred to as cathodes.

In some embodiments, referring to FIG. 3A, second electrodes 1102 in the plurality of first light-emitting devices 110 are, for example, a planar electrode, and need to cover the entire first display area 11, so that an area enclosed by outer contour lines of the second electrodes 1102 is the first display area 11. For example, there are a plurality of fourth electrodes 1202, two adjacent fourth electrodes 1202 are spaced a certain distance apart, and a second electrode 1102 and a fourth electrode 1202 that are adjacent to each other are spaced a certain distance apart. An area enclosed by outer contour lines of the plurality of fourth electrodes 1202 is the second display area 12.

In some embodiments, referring to FIG. 3A, the fourth electrodes 1202 are strip-shaped electrodes, and each strip-shaped electrode has, for example, a rectangular shape. In some other embodiments, referring to FIG. 3B, the shape of the fourth electrode 1202 is related to outer contours of third electrodes 1201 included in a column of third display units 122. Each third display unit 122 includes three second light-emitting devices 120. Light-emitting colors of the three second light-emitting devices 120 are respectively three primary colors, and the light-emitting color of each second light-emitting device 120 is one of the three primary colors.

Since the first display area 11 may be determined according to the outer contour lines of the second electrodes 1102, and in the display area of the display panel 1, other area except the first display area 11 is the second display area 12, the first display area 11 and the second display area 12 may be divided by the second electrodes 1102. It will be understood by those skilled in the art that the display panel 1 may further have a non-display area in addition to the display area. In the embodiments of the present disclosure, there is no limitation on whether the display panel 1 has the non-display area.

Referring to FIGS. 1D and 1F, the second driving circuit 121 is disposed on the substrate 13. The second driving circuit 121 is coupled to the plurality of second light-emitting devices 120, and is configured to passively drive the plurality of second light-emitting devices 120 to emit light.

Figure 4A:
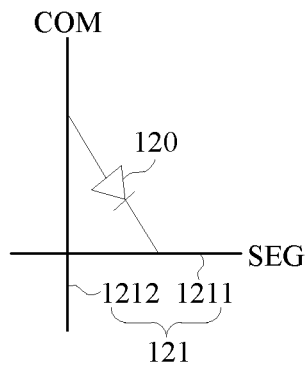
FIG. 4A is an equivalent circuit diagram of a second driving circuit and a second light-emitting device, in accordance with some embodiments of the present disclosure.

For example, referring to FIG. 4A, FIG. 4A is an equivalent circuit diagram of the second driving circuit 121 and the second light-emitting device 120. The second driving circuit 121 includes first electrode lines 1211 and second electrode lines 1212. A first electrode line 1211 is configured to provide a signal to third electrodes 1201, and a second electrode line 1212 is configured to provide a signal to fourth electrodes 1202.

For example, the signal provided by the first electrode line 1211 to the third electrodes 1201 is, for example, a second data signal SEG, which is configured to control the brightness of the second light-emitting device 120. The second electrode line 1212 is configured to provide a common signal COM to the fourth electrodes 1202. For example, a magnitude of the common signal COM is equal to a magnitude of the power supply voltage signal VSS' provided by the power supply voltage signal terminal VSS, and the power supply voltage signal VSS' is, for example, 0 V.

Figure 4B:
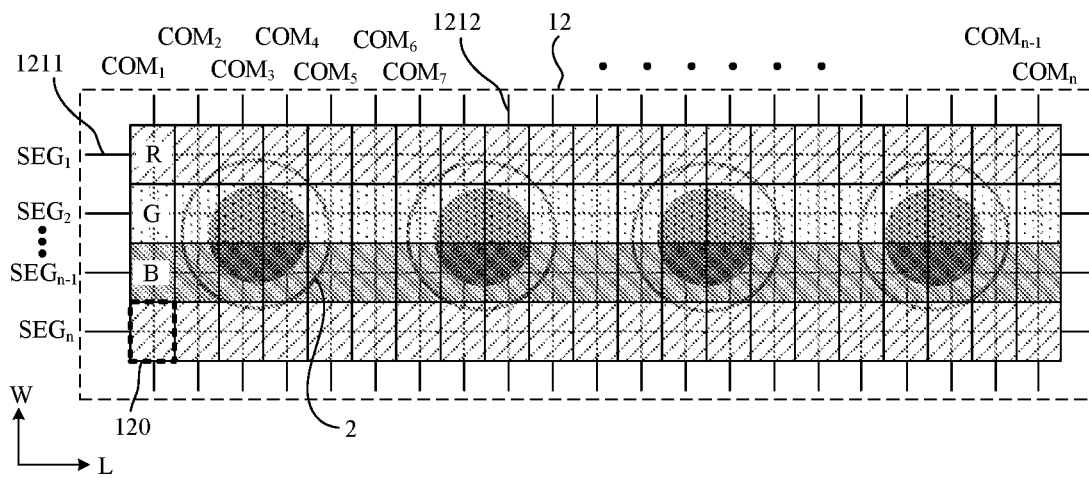
FIG. 4B is a top view showing a distribution of a second driving circuit and second light-emitting devices, in accordance with some embodiments of the present disclosure.

For example, referring to FIG. 4B, FIG. 4B is a structural diagram showing connection relationships between the second driving circuit 121 and the second light-emitting devices 120. The first electrode lines 1211 of the second driving circuit 121 extend in the second direction L, and the second electrode lines 1212 of the second driving circuit 121 extend in the first direction W. Second light-emitting devices 120 in a same row are coupled to a same second electrode line 1212, and second light-emitting devices 120 in a same column are coupled to a same first electrode line 1211. In FIG. 4B, second light-emitting devices 120 in a same column have a same light-emitting color, and second light-emitting devices 120 in a same row have different light-emitting colors.

Referring to FIG. 4B, the second driving circuit 121 operates, for example, in a form of turning on the plurality of second light-emitting devices 120 column by column. That is, the second driving circuit 121 sequentially turns on a first column of second light-emitting devices 120, a second column of second light-emitting devices 120, until an n-th column of second light-emitting devices 120, and n is a positive integer greater than 1. For example, an operating process of turning on the first column of second light-emitting devices 120 by the second driving circuit 121 is as follows. A first electrode line $SEG_1$ to an n-th first electrode line $SEG_n$ transmit respective second data signals SEG to respective rows of second light-emitting devices 120. Then, a first second electrode line COW transmits the common signal COM to the first column of second light-emitting devices 120, so that the first column of second light-emitting devices 120 start emitting light under a control of the second data signal SEG and the common signal COM. For example, an effective level of the common signal COM is a low level. When the first column of second light-emitting devices 120 emit light, the common signal COM transmitted by the first second electrode line $COM_1$ to the first column of second light-emitting devices 120 is at a low level, and the common signals COM transmitted by other second electrode lines to respective columns of second light-emitting devices 120 are each at a high level.

Referring to FIGS. 1D and 1F, orthographic projection(s) of at least one of the plurality of second light-emitting devices 120 on the substrate 13 are overlapped with an orthogonal projection of the gap on the substrate 13.

For example, referring to FIG. 1D, part of an orthographic projection of the third electrode 1201 of the second light-emitting device 120 on the substrate 13 is within the orthogonal projection of the gap on the substrate 13; and part of an orthographic projection of the second light-emitting functional pattern 1203 of the second light-emitting device 120 on the substrate 13 is within the orthogonal projection of the gap on the substrate 13. The width of the gap is, for example, d.

In some other embodiments, part of the orthographic projection of the third electrode 1201 of the second light-emitting device 120 on the substrate 13 is within the orthogonal projection of the gap on the substrate 13; and the orthographic projection of the second light-emitting functional pattern 1203 of the second light-emitting device 120 on the substrate 13 is not within the orthogonal projection of the gap on the substrate 13, and the width of the gap is, for example, d. This is not shown in the drawings.

For another example, referring to FIG. 1F, orthographic projections of third electrodes 1201 of some second light-emitting devices 120 on the substrate 13 are entirely within the orthogonal projection of the gap on the substrate 13, such as second light-emitting devices 120 closest to the first display area 11; and orthographic projections of second light-emitting functional patterns 1203 of those second light-emitting devices 120 on the substrate 13 are entirely within the orthogonal projection of the gap on the substrate 13. The width of the gap is, for example, d'.

In some other embodiments, in the second light-emitting device 120, part of the orthographic projection of the third electrode 1201 on the substrate 13 and part of the orthographic projection of the second light-emitting functional pattern 1203 on the substrate 13 are within the orthogonal projection of the gap on the substrate 13, and the width of the gap is, for example, d'. This is not shown in the drawings.

Based on the above, the case where the part of the orthographic projection of the third electrode 1201 of the second light-emitting device 120 on the substrate 13 and the part of the second light-emitting functional pattern 1203 of the second light-emitting device 120 on the substrate 13 are within the orthogonal projection of the gap on the substrate 13, and the case where only the part of the orthographic projection of the third electrode 1201 on the substrate 13 is within the orthogonal projection of the gap on the substrate 13, are cases where the orthographic projection of the second light-emitting device 120 on the substrate 13 is overlapped with the orthogonal projection of the gap on the substrate 13.

It will be understood by those skilled in the art that the location and the size of the second light-emitting functional pattern 1203 are related to the location and the size of the third electrode 1201.

For example, referring to FIG. 1D, a minimum width, along the first direction W, of the gap between the orthographic projection of the signal line 1110 on the substrate 13 and the orthogonal projection of the first display area 11 on the substrate 13 is d. In this case, a minimum width, along the first direction W, of a gap between the orthographic projection of the signal line 1110 on the substrate 13 and an orthographic projection of the first light-emitting device 110 on the substrate 13 is, for example, d1. A minimum width, along the first direction W, of a gap between the orthographic projection of the first light-emitting device 110 on the substrate 13 and the orthographic projection of the second light-emitting device 120 on the substrate 13 is, for example, d2. Here, d1 is greater than d and d2.

Based on the structure of the display panel 1 shown in FIG. 1D, the distribution of the first light-emitting devices 110 and the second light-emitting devices 120 may be simplified to the structure shown in FIG. 1E in which a minimum width, along the first direction W, of a gap between the first light-emitting device 110 and the second light-emitting device 120 is d2. For example, d2 is 20 μm.

For another example, referring to FIG. 1F, a minimum width, along the first direction W, of the gap between the orthographic projection of the signal line 1110 on the substrate 13 and the orthogonal projection of the first display area 11 on the substrate 13 is d'. In this case, a minimum width, along the first direction W, of the gap between the orthographic projection of the signal line 1110 on the substrate 13 and the orthographic projection of the first light-emitting device 110 on the substrate 13 is, for example, d1'. A minimum width, along the first direction W, of the gap between the orthographic projection of the first light-emitting device 110 on the substrate 13 and the orthographic projection of the second light-emitting device 120 on the substrate 13 is, for example, d2'. Here, d1' is greater than d' and d2'.

It will be noted that d1 is greater than d and d2, which should be understood that d1 is greater than d and d1 is greater than d2, and a relationship between d and d2 is not limited. Similarly, d1' is greater than d' and d2', which should be understood that d1' is greater than d' and d1' is greater than d2', and a relationship between d' and d2' is not limited.

Based on the structure of the display panel 1 shown in FIG. 1F, the distribution of the first light-emitting devices 110 and the second light-emitting devices 120 may be simplified to the structure shown in FIG. 1G in which a minimum width, along the first direction, of a gap between the first light-emitting device 110 and the second light-emitting device 120 is d2'. For example, d2' is 30 μm.

Figure 5A:
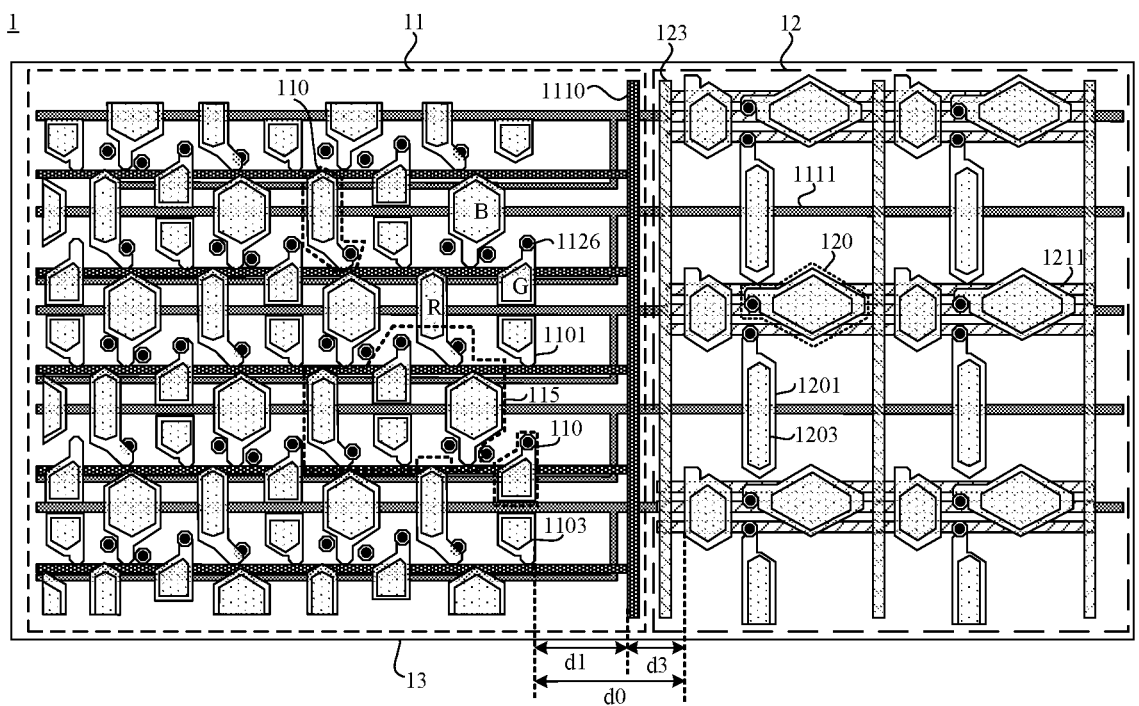
FIG. 5A is a top view of a display panel in the related art.

In the related art, referring to FIG. 5A, a display panel 1 has a first display area 11 and a second display area 12. The display panel 1 includes a first driving circuit, light-emitting devices 110, a second driving circuit and second light-emitting devices 120. The first driving circuit is disposed on a substrate 13, and the first light-emitting devices 110 are located in the first display area 11. The second driving circuit and the second light-emitting devices 120 are located in the second display area 12. The first driving circuit is configured to actively drive the first light-emitting devices 110 to emit light, and the second driving circuit is configured to passively drive the second light-emitting devices 120 to emit light. The first driving circuit includes pixel driving circuits and a signal line 1110. Scan signal lines 1111 in the first driving circuit extend from the first display area 11 to the second display area 12, and the signal line 1110 is entirely located in the first display area 11. A minimum width of a gap between an orthographic projection of the signal line 1110 on the substrate 13 and an orthographic projection of the first light-emitting device 110 on the substrate 13 is, for example, d1. Since the second light-emitting devices 120 are located in the second display area 12, the orthographic projection of the signal line 1110 on the substrate 13 and an orthographic projection of the second light-emitting device 120 on the substrate 13 have a gap therebetween, and a minimum width of this gap is, for example, d3. Therefore, a minimum width d0 of a gap between the orthographic projection of the first light-emitting device 110 on the substrate 13 and the orthographic projection of the second light-emitting device 120 on the substrate 13 is substantially equal to a sum of d1 and d3 (i.e., d1+d3), so that d0 is known to be greater than d1 and d3. Since the minimum width d1 of the gap between the orthographic projection of the signal line 1110 on the substrate 13 and the orthographic projection of the first light-emitting device 110 on the substrate 13 cannot meet a requirement of providing another column of pixels between the signal line 1110 and the first light-emitting device 110, in the related art, there is no orthographic projection of another light-emitting device between the orthographic projection of the signal line 1110 on the substrate 13 and the orthographic projection of the first light-emitting device 110 on the substrate 13. A pixel includes, for example, three first light-emitting devices 110 with different light-emitting colors, and a light-emitting color of each first light-emitting device 110 is one of three primary colors.

Figure 5B:
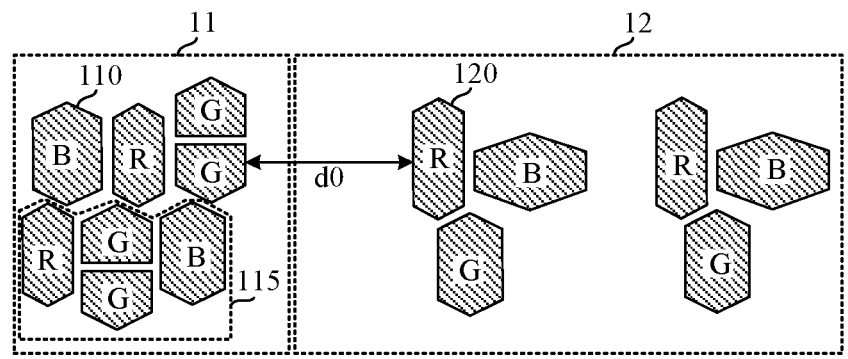
FIG. 5B is a top view showing a distribution of first light-emitting devices and second light-emitting devices in the related art.

Since the minimum width of the gap between the orthographic projection of the first light-emitting device 110 on the substrate 13 and the orthographic projection of the second light-emitting device 120 on the substrate 13 is d0, and the first light-emitting devices 110 and the second light-emitting devices 120 are arranged in a same layer and made of a same material, the gap between the orthographic projection of the first light-emitting device 110 on the substrate 13 and the orthographic projection of the second light-emitting device 120 on the substrate 13 may be understood as a gap between the first light-emitting device 110 and the second light-emitting device 120. Based on the structure of the display panel 1 shown in FIG. 5A, the distribution of the first light-emitting devices 110 and the second light-emitting devices 120 may be simplified to the structure shown in FIG. 5B in which the minimum width of the gap between the first light-emitting device 110 and the second light-emitting device 120 is d0. For example, the minimum width d0 of the gap between the orthographic projection of the first light-emitting device 110 on the substrate 13 and the orthographic projection of the second light-emitting device 120 on the substrate 13 is, for example, greater than 100 µm.

In the related art, the minimum width d0 of the gap between the first light-emitting device 110 and the second light-emitting device 120 is large, and a coverage of light emitted from the first light-emitting device 110 and the second light-emitting device 120 is limited. Therefore, in a case where d0 is large, the light emitted from the first light-emitting device 110 and the light-emitting device 120 located on two sides of the gap can not completely illuminate the gap, so that a region where the gap is located is in a dark state during display, and finally the display panel 1 displays dark spots and/or dark lines that may be recognized by human eyes, thereby affecting the display effect of the display panel 1. Since a minimum size that may be recognized by human eyes is 100 µm, and d0 in the related art is often larger than 100 µm, the dark spots and/or the dark lines at the gap may be recognized by human eyes.

In the related art, since the minimum width d2 of the gap between the first light-emitting device 110 and the second light-emitting device 120 is substantially equal to d1+d3, factors affecting the minimum width d2 of the gap between the first light-emitting device 110 and the second light-emitting device 120 include the minimum width d1 of the gap between the orthographic projection of the signal line 1110 on the substrate 13 and the orthographic projection of the first light-emitting device 110 on the substrate 13, and the minimum width d3 of the gap between the orthographic projection of the signal line 1110 on the substrate 13 and the orthographic projection of the second light-emitting device 120 on the substrate 13.

For example, referring to FIGS. 1D and 5A, the minimum width of the gap between the orthographic projection of the signal line 1110 on the substrate 13 and the orthographic projection of the first light-emitting device 110 on the substrate 13 in the related art is substantially equal to the minimum width of the gap between the orthographic projection of the signal line 1110 on the substrate 13 and the orthographic projection of the first light-emitting device 110 on the substrate 13 in the embodiments of the present disclosure, i.e., both d1. However, in the embodiments of the present disclosure, since the orthographic projection of the signal line 1110 on the substrate 13 is overlapped with the orthographic projection of the second light-emitting device 120 on the substrate 13, there is no gap between the orthographic projection of the signal line 1110 on the substrate 13 and the orthographic projection of the second light-emitting device 120 on the substrate 13, so that the minimum width d2 of the gap between the first light-emitting device 110 and the second light-emitting device 120 is less than d1. However, in the related art, the minimum width of the gap between the first light-emitting device 110 and the second light-emitting device 120 is d0, and d0 is greater than d1 (i.e., d0>d1), so that the minimum width d0 of the gap between the first light-emitting device 110 and the second light-emitting device 120 in the related art is greater than the minimum width d2 of the gap between the first light-emitting device 110 and the second light-emitting device 120 in the embodiments of the present disclosure. Therefore, referring to FIG. 1D, compared to the related art, the minimum width d1 of the gap between the orthographic projection of the signal line 1110 on the substrate 13 and the orthographic projection of the first light-emitting device 110 on the substrate 13 is kept constant, and the minimum width of the gap between the orthographic projection of the signal line 1110 on the substrate 13 and the orthographic projection of the second light-emitting device 120 on the substrate 13 is reduced by providing the signal line 1110 in the second display area 12, so that the minimum width of the gap between the first light-emitting device 110 and the second light-emitting device 120 is reduced.

For another example, referring to FIGS. 1F and 5A, firstly, the minimum width of the gap between the orthographic projection of the signal line 1110 on the substrate 13 and the orthographic projection of the second light-emitting device 120 on the substrate 13 in the related art is d3. However, in the embodiments of the present disclosure, since the orthographic projection of the signal line 1110 on the substrate 13 is overlapped with the orthographic projection of the second light-emitting device 120 on the substrate 13, there is no gap between the orthographic projection of the signal line 1110 on the substrate 13 and the orthographic projection of the second light-emitting device 120 on the substrate 13. Secondly, based on that the minimum width of the gap between the orthographic projection of the first light-emitting device 110 on the substrate 13 and the orthographic projection of the signal line 1110 on the substrate 13 is d1 in the related art, the minimum width of the gap between the orthographic projection of the first light-emitting device 110 on the substrate 13 and the orthographic projection of the signal line 1110 on the substrate 13 is reduced to d1'. Therefore, the minimum width d2' of the gap between the first light-emitting device 110 and the second light-emitting device 120 in some embodiments of the present disclosure is less than the minimum width d0 of the gap between the first light-emitting device 110 and the second light-emitting device 120 in the related art. Therefore, referring to FIG. 1F, compared to the related art, by providing the signal line 1110 in the second display area 12, the minimum width of the gap between the orthographic projection of the signal line 1110 on the substrate 13 and the orthographic projection of the second light-emitting device 120 on the substrate 13 is reduced, and the minimum width of the gap between the orthographic projection of the first light-emitting device 110 on the substrate 13 and the orthographic projection of the signal line 1110 on the substrate 13 is reduced, so that the minimum width of the gap between the first light-emitting device 110 and the second light-emitting device 120 is reduced.

In some embodiments of the present disclosure, the display panel 1 includes the first driving circuit 111, the first light-emitting devices 110, the second driving circuit 121 and the second light-emitting devices 120. The first driving circuit 111 includes the plurality of pixel driving circuits 112 and the signal line 1110. The signal line 1110 is located in the second display area 12, and extends substantially along the edge of the second display area 12 proximate to the first display area 11. The orthographic projection(s) of at least one of the plurality of second light-emitting devices 120 on the substrate 13 are overlapped with the orthogonal projection of the gap on the substrate 13. Since the signal line 1110 serves as an edge of the gap, in a case where the orthogonal projection of the gap on the substrate 13 is overlapped with the orthographic projection of the second light-emitting device 120 on the substrate 13, the orthographic projection of the signal line 1110 on the substrate 13 is also overlapped with the orthographic projection of the second light-emitting device 120 on the substrate 13. On one hand, on a premise that the minimum width of the gap between the orthographic projection of the first light-emitting device 110 on the substrate 13 and the orthographic projection of the signal line 1110 on the substrate 13 is the same, in the embodiments of the present disclosure, the orthographic projection of the signal line 1110 on the substrate 13 is overlapped with the orthographic projection of the second light-emitting device 120 on the substrate 13, so that there is no gap between the orthographic projection of the signal line 1110 on the substrate 13 and the orthographic projection of the second light-emitting device 120 on the substrate 13, thereby reducing the minimum width of the gap between the first light-emitting device 110 and the second light-emitting device 120. On another hand, in the embodiments of the present disclosure, the orthographic projection of the signal line 1110 on the substrate 13 is overlapped with the orthographic projection of the second light-emitting device 120 on the substrate 13, and the minimum width of the gap between the orthographic projection of the signal line 1110 on the substrate 13 and the orthographic projection of the first light-emitting device 110 on the substrate 13 is reduced, so that the minimum width of the gap between the first light-emitting device 110 and the second light-emitting device 120 is further reduced. In the embodiments of the present disclosure, the minimum width of the gap between the first light-emitting device 110 and the second light-emitting device 120 may be set small, which is conducive to reducing the minimum width of the gap between the first light-emitting device 110 and the second light-emitting device 120 to a range that can not be recognized by human eyes. Thus, even if the light emitted from the first light-emitting device 110 and the second light-emitting device 120 located on the two sides of the gap can not completely illuminate the gap, i.e., the gap is still in the dark state, the minimum width of the gap is less than a recognition accuracy of human eyes. Therefore, during display, human eyes can not recognize the dark spots or dark lines at the gap between the first light-emitting device 110 and the second light-emitting device 120, so that the display effect of the display panel 1 is improved.

In some embodiments, referring to FIGS. 1D, 1E, 1F and 1G, a minimum distance in distances each of which is a distance between any adjacent first light-emitting device 110 and second light-emitting device 120 is less than or equal to 60 μm. That is, d2 and d2' are each less than or equal to 60 μm.

The minimum distance in the distances each of which is the distance between the first light-emitting device 110 and the second light-emitting device 120 is the minimum width of the gap between the first light-emitting device 110 and the second light-emitting device 120. Since 60 μm is less than a minimum recognizable size of human eyes, even if the gap between the first light-emitting device 110 and the second light-emitting device 120 is in the dark state, human eyes can not recognize the dark state, which ensures that the display panel 1 displays no dark spots and/or dark lines that may be recognized by human eyes, thereby improving the display effect of the display panel 1.

Figure 6A:
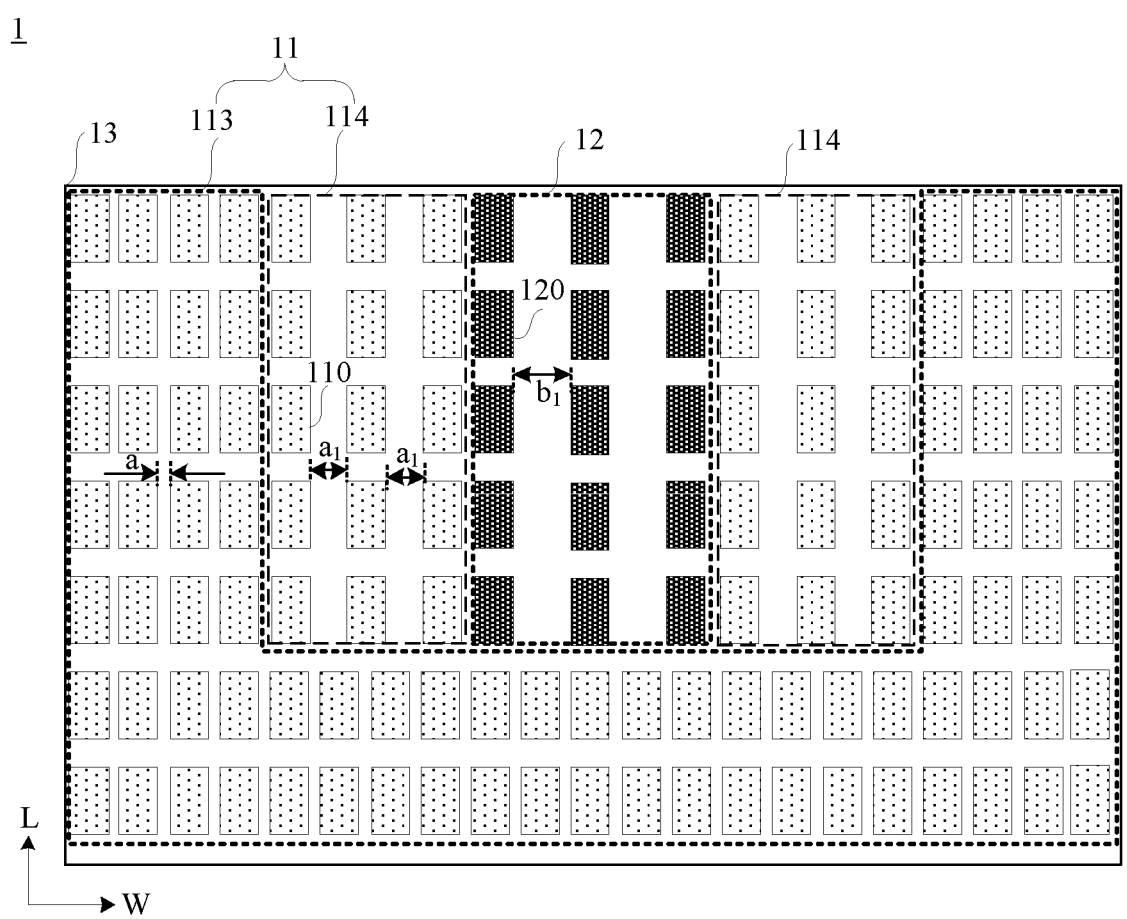
FIGS. 6A and 6B are top views of yet other display panels, in accordance with some embodiments of the present disclosure.
Figure 6B:
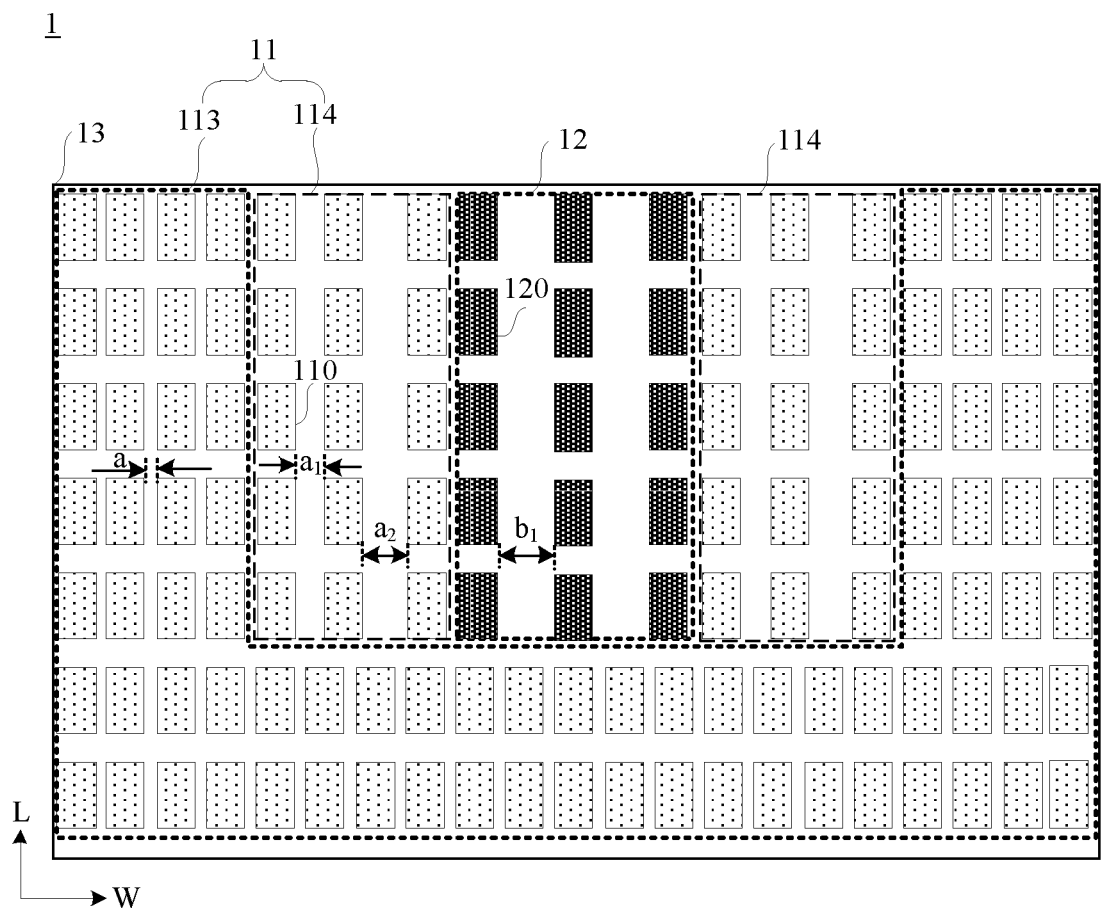

In some embodiments, referring to FIGS. 6A and 6B, the first display area 11 includes a first sub-area 113 and two second sub-areas 114 arranged opposite to each other along the first direction W, and the second sub-areas 114 are located between the first sub-area 113 and the second display area 12. A length of the second sub-area 114 is substantially equal to a length of the second display area 12, and a length direction of the second sub-area 114 is the second direction L. The second direction L is perpendicular to the first direction W. For example, the first direction W is, for example, a width direction of the display panel 1, and the second direction is, for example, a length direction of the display panel 1, and vice versa.

Along the first direction W, a minimum distance in distances each of which is a distance between any two first light-emitting devices 110 located in the first sub-area 113 is less than a minimum distance in distances each of which is a distance between any two first light-emitting devices 110 located in the second sub-area 114.

Referring to FIGS. 6A and 6B, in the first sub-area 113, along the first direction W, distances each of which is a distance between two adjacent first light-emitting devices 110 are, for example, equal, and the distance is, for example, a. In the second display area 12, along the first direction W, distances each of which is a distance between two adjacent second light-emitting devices 120 are, for example, equal, and the distance is, for example, $b_1$. Moreover, $b_1$ is greater than a.

Based on the above, in some embodiments, referring to FIG. 6A, in the second sub-area 114, along the first direction, distances each of which is a distance between two adjacent first light-emitting devices 110 are, for example, equal, and the distance is, for example, $a_1$. For example, in three first light-emitting devices 110 in a first row in the second sub-area 114, a distance between a first light-emitting device 110 and a second first light-emitting device 110 is $a_1$, and a distance between the second first light-emitting device 110 and a third first light-emitting device 110 is $a_1$, and $a_1$ is greater than a (i.e., $a_1$>a).

In some other embodiments, referring to FIG. 6B, along the first direction W, first light-emitting devices 110 located in the first sub-area 113 are arranged at equal distances, and the distance is, for example, a; distances, each of which is a distance between two adjacent light-emitting devices 110 located in the second sub-area 114, are increased in sequence. For example, in the three first light-emitting devices 110 in the first row in the second sub-area 114, the distance between the first light-emitting device 110 and the second first light-emitting device 110 is $a_1$, and the distance between the second first light-emitting device 110 and the third first light-emitting device 110 is $a_2$, and $a_2$ is greater than $a_1$ that is greater than a (i.e., $a_2$>$a_1$>a).

Referring to FIGS. 6A and 6B, it can be known that $b_1$>$a_2$>$a_1$>a. That is, along the first direction W, the distance between two adjacent second light-emitting devices 120 in the second display area 12 is greater than the distance between two adjacent first light-emitting devices 110 in the first display are 11. Thus, a resolution of the second display area 12 is less than a resolution of the first display area 11. For example, the resolution of the second display area 12 is equal to half of the resolution of the first display area 11. When the second display area 12 is not displaying, a high light transmittance is required, so that the sensor 2 located on the non-light exit side of the display panel 1 receives light. Therefore, the resolution of the second display area 12 is reduced, so that the number of third electrodes 1201 and fourth electrodes 1202 in the second display area 12 is small, so as to improve the light transmittance of the second display area 12.

Based on the above, referring to FIG. 6A, in a case where the first light-emitting devices 110 in the second sub-area 114 are arranged at equal distances (i.e., $a_1$), it is convenient to manufacture first light-emitting devices 110 in the second sub-area 114. Referring to FIG. 6B, the distance between two adjacent second light-emitting devices 120 in the second display area 12 is greater than the distance between two adjacent first light-emitting devices 110 in the second sub-area 114, and the second sub-area 114 is adjacent to the second display area 12. Therefore, the distances, each of which is the distance between two adjacent first light-emitting devices 110 in the second sub-area 114, are increased in sequence, so that a distance between two adjacent first light-emitting devices 110 closer to the second display area 12, is closer to the distance between two adjacent second light-emitting devices 120 in the second display area 12. In this way, during display, the transition between the first display area 11 and the second display area 12 is smoother, and the display effect is better.

Figure 8:
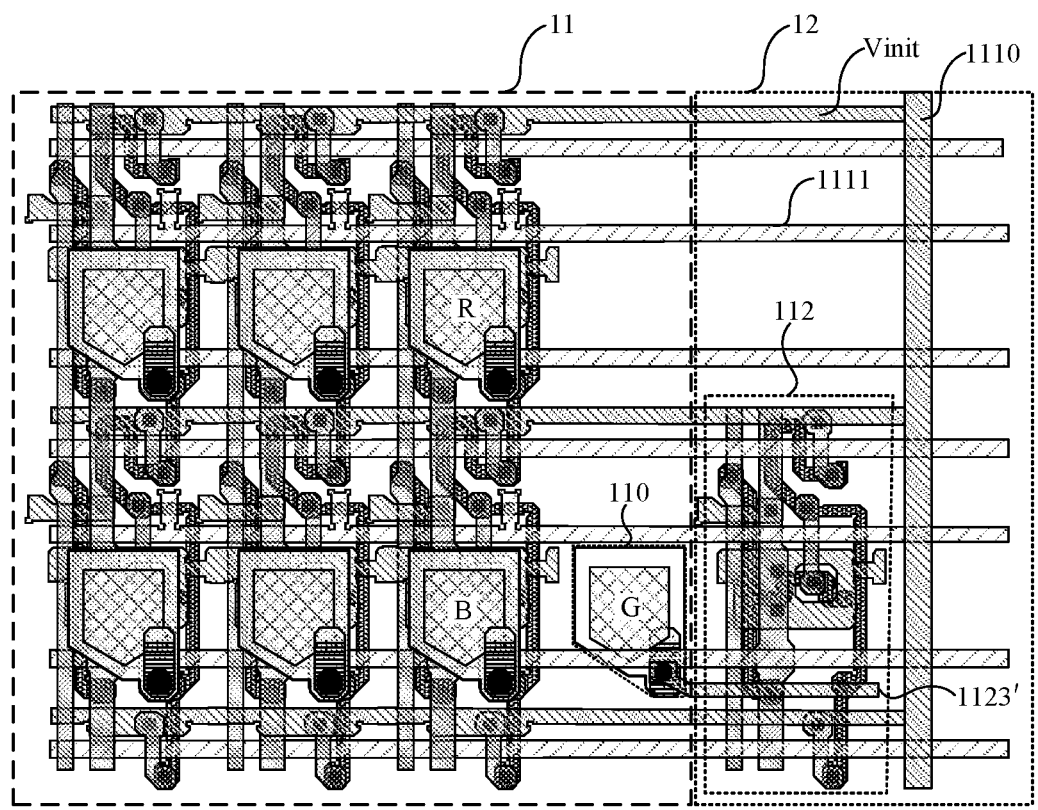
FIG. 8 is a top view of yet another display panel, in accordance with some embodiments of the present disclosure.

In some embodiments, referring to FIGS. 1F and 8, orthographic projection(s), on the substrate 13, of pixel driving circuit(s) 112 that are respectively coupled to first light-emitting device(s) 110 proximate to the second display area 12 are overlapped with the orthogonal projection of the gap on the substrate 13. The gap is the gap between the orthogonal projection of the first display area 11 on the substrate 13 and the orthographic projection of the signal line 1110 on the substrate 13.

Since the signal line 1110 is located in the second display area 12, a gap between the signal line 1110 and the first display area 11 is entirely located in the second display area 12. In a case where the orthographic projection(s), on the substrate 13, of the pixel driving circuit(s) 112 that are respectively coupled to the first light-emitting device(s) 110 proximate to the second display area 12 are overlapped with the orthogonal projection of the gap (i.e., the gap between the orthogonal projection of the first display area 11 on the substrate 13 and the orthographic projection of the signal line 1110 on the substrate 13) on the substrate 13, the pixel driving circuit(s) 112 are actually disposed in the second display area 12. Although the pixel driving circuit(s) 112 are disposed in the second display area 12, the first light-emitting device(s) 110 that are respectively coupled to the pixel driving circuit(s) 112 disposed in the second display area 12 are still disposed in the first display area 11, so that the gap between the first light-emitting device 110 and the second light-emitting device 120 is fully utilized, which is conducive to further reducing the minimum width of the gap between the first light-emitting device 110 and the second light-emitting device 120.

In some embodiments, referring to FIGS. 1F and 1G, the first light-emitting devices 110 in the first display area 11 constitute a plurality of first display units 115 and a plurality of second display units 116. The plurality of second display units 116 are closer to the second display area 12 than the plurality of first display units 115.

For example, referring to FIGS. 1F and 1G, a first display unit 115 and a second display unit 116 each include first light-emitting devices 110 with light-emitting colors of three primary colors. A light-emitting color of each first light-emitting device 110 is one of the three primary colors. The first display unit 115 includes, for example, four first light-emitting devices 110, and the second display unit 116 includes, for example, three first light-emitting devices 110. For example, the three primary colors are red, green and blue, respectively. The four first light-emitting devices included in the first display unit 115 are, for example, a first light-emitting device 110 with a light-emitting color of red (R), a first light-emitting device 110 with a light-emitting color of blue (B), and two first light-emitting devices 110 with a light-emitting color of green (G), respectively. Moreover, the two first light-emitting devices 110 with the light-emitting color of green are located between the first light-emitting device 110 with the light-emitting color of red and the first light-emitting device 110 with the light-emitting color of blue. In a first display unit 115, one of the two first light-emitting devices with the light-emitting color of green is configured to be coupled to a pixel driving circuit 112 located in a previous row, and another one of the two first light-emitting devices with the light-emitting color of green is configured to be coupled to a pixel driving circuit 112 located in a current row. The three first light-emitting devices 110 included in the second display unit 116 are, for example, a first light-emitting device 110 with a light-emitting color of red (R), a first light-emitting device 110 with a light-emitting color of blue (B), and a first light-emitting device 110 with a light-emitting color of green (G), respectively.

In some embodiments, two adjacent first display units 115 share a first light-emitting device 110, and a first display unit 115 and a second display unit 116 that are adjacent to each other may also share a first light-emitting device 110. For example, referring to FIG. 1G, the first display unit 115 and the second display unit 116 that are adjacent to each other share a first light-emitting device 110 with a light-emitting color of blue. For example, a pattern of the first display unit 115 and the second display unit 116 sharing the first light-emitting device 110 refers to the sharing relationship of sub-pixels in the Pentile arrangement. Here, a sub-pixel corresponds to a first light-emitting device 110.

Referring to FIG. 5A, in the related art, the first display area 11 includes only first display units 115. However, in the embodiments of the present disclosure, the first display area 11 includes the first display units 115 and the second display units 116. The minimum width of the gap between the orthographic projection of the signal line 1110 on the substrate 13 and the orthographic projection of the first light-emitting device 110 on the substrate 13 is reduced due to the second display units 116.

On this basis, in some embodiments, the four first light-emitting devices 110 in the first display unit 115 are distributed in the same way as the three first light-emitting devices 110 in the second display unit 116, which facilitates the synchronous manufacturing of the first display units 115 and the second display units 116.

Since the second display unit 116 includes the first light-emitting devices 110 whose light-emitting colors are the three primary colors, the second display unit 116 may display normally, so that after the second display units 116 are added, the display effect of the first display area 11 is ensured.

It will be noted that referring to FIG. 5A, the minimum width of the gap between the orthographic projection of the signal line 1110 on the substrate 13 and the orthographic projection of the first light-emitting device 110 on the substrate 13 is d1, and this minimum width is not wide enough to arrange a complete column of pixels. Comparing FIG. 5A and FIG. 1F, a column of second display units 116 are added in the first display area in FIG. 1F based on FIG. 5A, and each second display unit 116 includes the three first light-emitting devices 110, which is equivalent to a pixel. However, in FIG. 5A, on a premise of keeping the locations and sizes of other structures unchanged, even if first light-emitting devices 110 are added, a maximum of two columns of first light-emitting devices 110 with the light-emitting colors of red and blue may be added. First light-emitting devices 110 with the same light-emitting color may be understood as a column. Only the two columns of first light-emitting devices 110 are added, which can not constitute pixels for normal display due to the lack of first light-emitting devices 110 with the light-emitting color of green. Although the first light-emitting devices 110 in the first display area 11 may be shared when constituting pixels, only the two columns of first light-emitting devices 110 are added, it is impossible to realize the normal display, and there are always some first light-emitting devices 110 are left and can not constitute pixels for display. Therefore, in the related art, two additional columns of first light-emitting devices 110 are not disposed between the first light-emitting device 110 and the signal line 1110.

In some embodiments, referring to FIG. 1F, orthographic projection(s), on the substrate 13, of pixel driving circuit(s) 112 respectively coupled to at least one first light-emitting device 110 in the second display unit 116 are overlapped with the orthogonal projection of the gap on the substrate 13. The gap is the gap between the orthogonal projection of the first display area 11 on the substrate 13 and the orthographic projection of the signal line 1110 on the substrate 13.

For example, a pixel driving circuit 112 coupled to the first light-emitting device 110 with the light-emitting color of green (G) in the second display unit 116 is disposed in the second display area 12. Since an area of the first light-emitting device 110 with the light-emitting color of green is less than areas of first light-emitting devices 110 with the light-emitting colors of red (R) and blue (B), the pixel driving circuit 112 coupled to the first light-emitting device 110 with the light-emitting color of green is disposed in the second display area 12, so as to make reasonable use of a space in the first display area 11 close to the second display area 12.

Since the first light-emitting device 110 with the light-emitting color of green is closest to the second display area 12, the pixel driving circuit 112 coupled to the first light-emitting device 110 with the light-emitting color of green is disposed in the second display area 12, so that the minimum width of the gap between the orthographic projection of the signal line 1110 on the substrate 13 and the orthographic projection of the first light-emitting device 110 on the substrate 13 may be minimized.

In some embodiments, referring to FIG. 1F, an orthographic projection, on the substrate 13, of a first light-emitting device 110 coupled to a pixel driving circuit 112, whose orthographic projection on the substrate 13 is overlapped with the orthogonal projection of the gap on the substrate 13, is non-overlapped with an orthographic projection of this pixel driving circuit 112 on the substrate 13. The gap is the gap between the orthogonal projection of the first display area 11 on the substrate 13 and the orthographic projection of the signal line 1110 on the substrate 13.

For example, referring to FIG. 1F, in the second display unit 116, the first light-emitting device 110 with the light-emitting color of green (G) is disposed in the first display area 11, and a pixel driving circuit 112 configured to drive the first light-emitting device 110 with the light-emitting color of green is disposed in the second display area 12. Therefore, an orthographic projection, on the substrate 13, of the first light-emitting device 110 with the light-emitting color of green is non-overlapped with an orthographic projection, on the substrate 13, of the pixel driving circuit 112 configured to drive the first light-emitting device 110 with the light-emitting color of green.

Since the pixel driving circuit, whose orthographic projection on the substrate 13 is overlapped with the orthogonal projection of the gap on the substrate 13, is disposed in the second display area 12, and the first light-emitting devices 110 in the first display area 11 have the sharing relationship, the pixel driving circuit 112 is disposed in order to ensure the display effect of the first display area 11 and to make reasonable use of a side of the second display area 12 proximate to the first display area 11. Thus, the first light-emitting device 110 with the light-emitting color of green is still disposed in the first display area 11 to ensure the normal display of the first display area 11, and the pixel driving circuit 112 configured to drive the first light-emitting device 110 with the light-emitting color of green is disposed in the second display area 12. Except that pixel driving circuits 112 respectively coupled to first light-emitting devices 110 with the light-emitting color of green in the second display units 116 are located in the second display area 12, other first light-emitting devices 110 and pixel driving circuits 112 respectively driving the other first light-emitting devices 110 are all located in the first display area 11.

In some embodiments, referring to FIGS. 1D to 1G, in the second display area 12, the plurality of second light-emitting devices 120 constitute a plurality of third display units 122. Each third display unit 122 includes second light-emitting devices 120 whose light-emitting colors are respectively the three primary colors, and the light-emitting color of each second light-emitting device 120 is one of the three primary colors. Moreover, the number of the second light-emitting devices 120 included in each third display unit 122 is the same as the number of the first light-emitting devices 110 included in the second display unit 116.

For example, referring to FIGS. 1D to 1G, each third display unit 122 includes three second light-emitting devices 120, such as a second light-emitting device 120 with a light-emitting color of red (R), a second light-emitting device 120 with a light-emitting color of green (G) and a second light-emitting device 120 with a light-emitting color of blue (B).

Since there is no shared second light-emitting device 120 in two adjacent third display units 122, at least three second light-emitting devices 120 with different light-emitting colors need to be disposed for normal display of the third display unit 122.

In some embodiments, referring to FIG. 10, since the first light-emitting device 110 includes the first electrode 1101 and the second electrode 1102 arranged opposite to each other, and the first light-emitting device 110 is actively driven, the second electrodes 1102 in all the first light-emitting devices 110 may be of an integrative structure.

For example, referring to FIGS. 3A and 3B, the second electrodes 1102 of the integrative structure are located in the first display area 11.

Based on the above, it will be understood by those skilled in the art that if all the first light-emitting devices 110 need to share the second electrode 102, all the first light-emitting devices 110 must be disposed in the first display area 11. Especially in a case where the display panel 1 includes the second display units 116, the first light-emitting devices 110 with the light-emitting color of green may only be located in the first display area 11, and the pixel driving circuits 112 respectively coupled to those first light-emitting devices 110 may be located in the first display area 11 or the second display area 12. In the embodiments of the present disclosure, as an example, the pixel driving circuits 112 respectively coupled to the first light-emitting devices 110 with the light-emitting color of green in the second display units 116 are located in the second display area 12.

In some embodiments, since the second light-emitting device 120 includes the third electrode 1201 and the fourth electrode 1202 arranged opposite to each other, and the second light-emitting device 120 is passively driven, fourth electrodes 1202 in second light-emitting devices 120 in a same column of third display units 122 may be of an integrative structure.

For example, referring to FIGS. 3A and 3B, the fourth electrodes 1202 of the integrative structure are located in the second display area 12, and each third display unit 122 includes three second light-emitting devices 120.

The second electrodes 1102 in all the first light-emitting devices 110 are of the integrative structure, and the fourth electrodes 1202 in the second light-emitting devices 120 in the same column of third display units 122 are of the integrative structure, which facilitates the manufacturing of the first light-emitting devices 110 and the second light-emitting devices 120, so as to save the manufacturing cost of the display panel 1.

In some embodiments, referring to FIGS. 3A and 3B, the display panel 1 further includes a plurality of separating structures 123.

The plurality of separating structures 123 are disposed in the second display area 12. The separating structures 123 are configured to separate the second electrode 1102 and the fourth electrode 1202 that are adjacent to each other, and to separate two adjacent fourth electrodes 1202.

Since the second electrode 1102 and the fourth electrode 1202 are arranged in a same layer, and are made of a same material, in order to manufacture the second electrode 1102 and the fourth electrode 1202 synchronously, a separating structure 123 needs to be disposed to separate the second electrode 1102 and the fourth electrode 1202 that are adjacent to each other. In addition, since the third display units 122 in the same column share the same fourth electrode 1202, two adjacent fourth electrodes 1202 also need to be separated. The separating structures 123 may separate the second electrode 1102 and the fourth electrode 1202 from each other, and separate two adjacent fourth electrodes 1202 from each other, which are all manufactured by, for example, evaporation.

For example, referring to FIGS. 1D and 1F, an orthographic projection, on the substrate 13, of the separating structure 123 for separating the second electrode 1102 and the fourth electrode 1202 that are adjacent to each other is overlapped with the orthogonal projection of the gap on the substrate 13. The gap is the gap between the orthogonal projection of the first display area 11 on the substrate 13 and the orthographic projection of the signal line 1110 on the substrate 13.

For example, referring to FIG. 1D, a top view of the separating structure 123 is, for example, rectangular. Referring to FIG. 1F, the top view of the separating structure 123 is, for example, approximately a square wave.

Figure 7A:
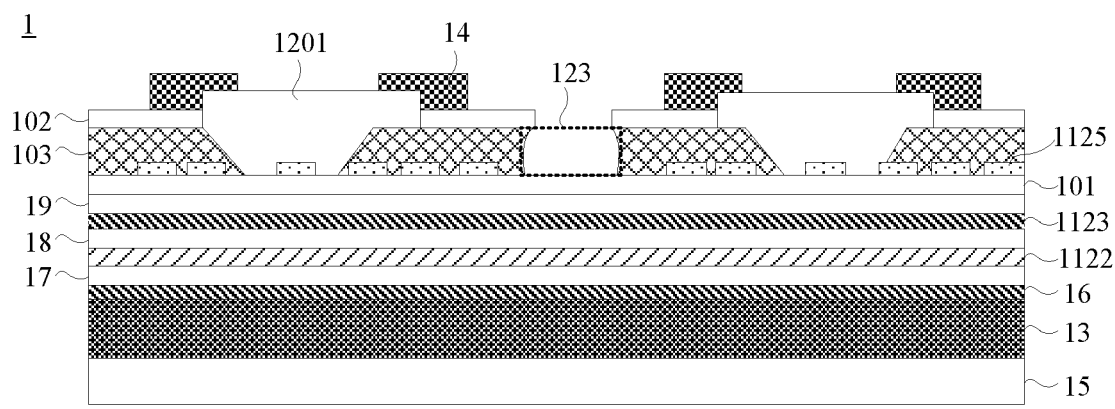
FIG. 7A is a longitudinal sectional view of a display panel taken along a first direction, in accordance with some embodiments of the present disclosure.

For example, referring to FIG. 7A, in the thickness direction of the display panel 1, the display panel 1 sequentially includes a carrier substrate 15, the substrate 13, a blocking layer 16, the first gate insulating layer 17, the gate metal layer 1122, the second gate insulating layer 18, the first metal layer 1123, the interlayer insulating layer 19, the first passivation layer 101, the third metal layer 1125, the planarization layer 103, a second passivation layer 102, the third electrodes 1201 and the pixel defining layer 14.

The carrier substrate 15 is made of, for example, glass. The carrier substrate 15 is configured to support the layers thereon during the manufacturing of the display panel 1.

The blocking layer 16 is made of, for example, silicon oxide (SiOx) and/or silicon nitride (SiN). The blocking layer 16 is configured to block impurity ions such as hydrogen ions (H) in the substrate 13, so as to prevent the impurity ions from affecting the active layer 1121 located on a side of the blocking layer 16 away from the substrate 13. It will be noted that since FIG. 7A is a longitudinal sectional view of a portion of the display panel 1 located in the second display area 12, the active layer 1121 and the second metal layer 1124 are not present in FIG. 7A. However, it will be understood by those skilled in the art that in a longitudinal sectional view of a portion of the display panel 1 located in the first display area 11, the active layer 1121 and the second metal layer 1124 are necessarily present. The active layer 1121 is located between the blocking layer 16 and the first gate insulating layer 17, and the second metal layer 1124 is located between the interlayer insulating layer 19 and the first passivation layer 101.

The first gate insulating layer 17, the second gate insulating layer 18, the interlayer insulating layer 19, the first passivation layer 101 and the second passivation layer 102 are each made of, for example, an inorganic insulating material, such as silicon oxide and/or silicon nitride.

The planarization layer 103 is made of, for example, an organic material, such as polyimide or resin.

The pixel defining layer 14 is made of, for example, an organic material, such as resin.

In some embodiments, referring to FIG. 7A, the separating structures 123 are disposed in the planarization layer 103. Due to the presence of the separating structures 123, the second passivation layer 102 located on the planarization layer 103 is disconnected at the separating structures 123. When the second electrode 1102 and the fourth electrodes 1202 are subsequently manufactured, the second electrode 1102 and the fourth electrode 1202 that are adjacent to each other are separated by the separating structure 123, and adjacent fourth electrodes 1202 are separated by the separating structure 123.

In some embodiments, referring to FIGS. 7A to 7D, the separating structure 123 is a separating pillar or separating groove. Whether the separating structure 123 is the separating pillar or the separating groove, the separating structure 123 may separate the second electrode 1102 and the fourth electrode 1202 that are adjacent to each other, and separate two adjacent fourth electrodes 1202.

Figure 7B:
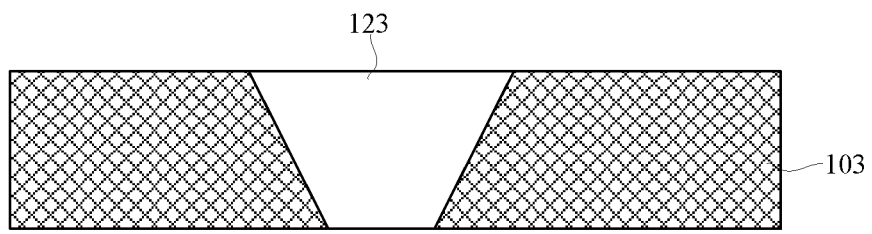
FIG. 7B is a longitudinal sectional view of a separating structure taken along a first direction, in accordance with some embodiments of the present disclosure.

For example, referring to FIGS. 7A and 7B, the separating structure 123 is the separating groove. Since a process of arranging a groove in the planarization layer 103 is simple, the separating structure 123 may be set as the separating groove. Referring to FIG. 7A, a wall of the separating groove is a curved surface. Referring to FIG. 7B, the wall of the separating groove is an inclined surface.

Figure 7C:
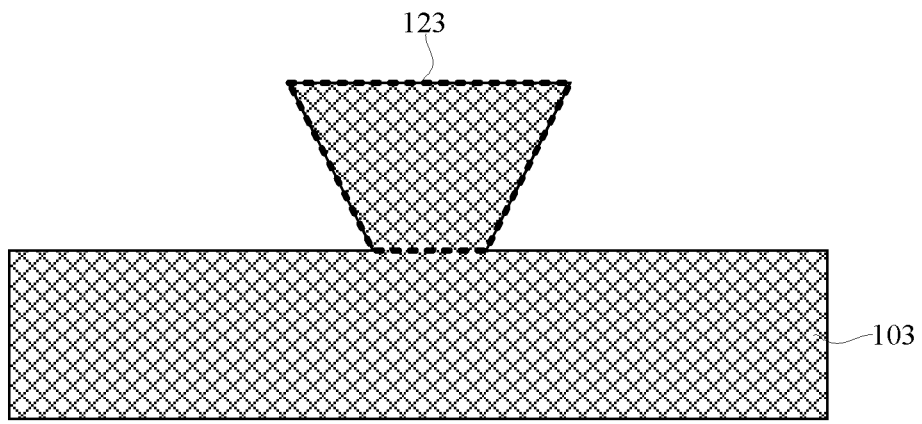
FIG. 7C is a longitudinal sectional view of another separating structure taken along a first direction, in accordance with some embodiments of the present disclosure.

For another example, referring to FIG. 7C, the separating structure 123 is the separating pillar. Due to a large level difference of the separating pillar, when the second electrode 1102 and the fourth electrodes 1202 are manufactured, the second electrode 1102 and the fourth electrode 1202 that are adjacent to each other are better ensured to be separated, and adjacent fourth electrodes 1202 are better ensured to be separated.

In some embodiments, referring to FIG. 7A, in a longitudinal section of the separating pillar or the separating groove, a length of a bottom edge is substantially equal to a length of a top edge. This structure is symmetrical and regular, and is easy to manufacture.

In some other embodiments, referring to FIGS. 7B and 7C, in the longitudinal section of the separating pillar or the separating groove, the length of the bottom edge is less than the length of the top edge, so that the side wall of the separating pillar or the separating groove may be the inclined surface, which is more conducive to manufacturing the second electrode 1102 and the fourth electrode 1202 that are separated from each other, and the fourth electrodes 1202 that are separated from each other.

It will be noted that the longitudinal section of the separating pillar or the separating groove is taken along the first direction.

Figure 7D:
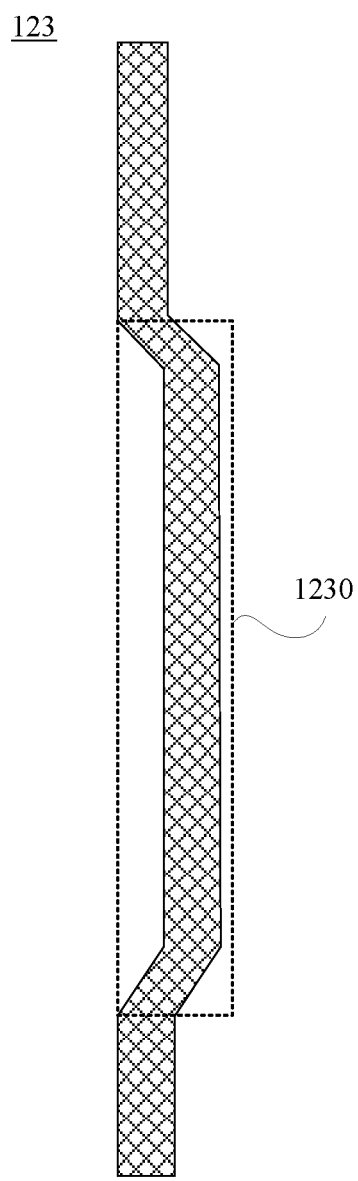
FIG. 7D is a top view of a separating structure, in accordance with some embodiments of the present disclosure.

In some embodiments, referring to FIGS. 1F and 7D, in a case where the orthographic projection(s), on the substrate 13, of the pixel driving circuit(s) respectively coupled to the at least one first light-emitting device 110 in the second display unit 116 are overlapped with the orthogonal projection of the gap on the substrate 13, the separating structure 123 includes a plurality of protrusions 1230 each protruding along a direction X from the first display area 11 to the second display area 12. The gap is the gap between the orthogonal projection of the first display area 11 on the substrate 13 and the orthographic projection of the signal line 1110 on the substrate 13.

Referring to FIG. 5A, a maximum width of a gap between the orthographic projection of the first light-emitting device 110 on the substrate 13 and an orthographic projection of a separating structure 123 on the substrate 13 is less than a maximum width of the second display unit 116. Moreover, since third electrodes 1201 are located on the planarization layer 103, an orthographic projection of a third electrode 1201 on the substrate 13 is non-overlapped with the orthographic projection of the separating structure 123 on the substrate 13. Thus, in order to add a column of second display units 116 in the first display area 11, the shape of the separating structure 123 need to be changed. For example, the plurality of protrusions 1230 are disposed to increase a maximum width of a gap between the orthographic projection of the first light-emitting device 110 on the substrate 13 and an orthographic projection of the separating structure 123 on the substrate 13, so that the column of second display units 116 may be added in the first display area 11.

For example, referring to FIG. 7D, the protrusion 1230 of the separating structure 123 protrudes along the direction X from the first display area 11 to the second display area 12. The protrusion 1230 protrudes along the direction X from the first display area 11 to the second display area 12, so that an enough space is left for the first light-emitting devices 110 with the light-emitting color of green (G) in the second display units 116.

Based on the above, referring to FIG. 5A, in the related art, although the gap exists between the orthographic projection of the separating structure 123 on the substrate 13 and the orthographic projection of the first light-emitting device 110 on the substrate 13, the width of the gap is small and insufficient to accommodate a second display unit 116, and a maximum of two first light-emitting devices 110 are able to be disposed. For example, the gap may accommodate two first light-emitting devices 110 with the light-emitting colors of red and blue. Due to the lack of the green first light-emitting device 110, a display unit composed of the two first light-emitting devices 110 cannot emit white light normally, which results in abnormal display. However, in the embodiments of the present disclosure, the maximum width of the gap between the orthographic projection of the separating structure 123 on the substrate 13 and the orthographic projection of the first light-emitting device 110 on the substrate 13 is increased by changing the separating structure 123, so that the second display units 116 may be disposed in the gap, thereby ensuring the normal display of the display panel 1.

In some embodiments, referring to FIGS. 1D and 1F, the first driving circuit 111 further includes the scan signal lines 1111. The scan signal lines 1111 are configured to provide scan signals to the pixel driving circuits 112. The scan signal lines 1111 extend along the first direction W.

The scan signals include, for example, the gate driving signals Gate", the light-emitting control signals EM" and the reset signals Reset". However, it will be understood by those skilled in the art that a scan signal line 1111 provides a single signal.

Since first display units 115 in a same row need to be driven synchronously, or first display units 115 and second display units 116 in a same row need to be driven synchronously, the first display units 115 in the same row need to be driven by the same scan signal line 1111, or the first display units 115 and the second display units 116 in the same row need to be driven by the same scan signal line 1111. Thus, the scan signal lines 1111 need to extend along the first direction W. Referring to FIGS. 1D and 1F, since the scan signal lines 1111 extend along the first direction W, the scan signal lines 1111 are also present in the second display area 12.

In some embodiments, referring to FIGS. 1F and 8, the pixel driving circuit(s) 112 respectively coupled to the at least one first light-emitting device 110 in the second display unit 116 are disposed in the second display area 12. The positional relationship of the pixel driving circuit 112 and the first light-emitting device 110 is, for example, as shown in FIG. 8. Except that the pixel driving circuits 112 respectively coupled to the first light-emitting devices 110 with the light-emitting color of green (G) in the second display units 116 are disposed in the second display area 12, the pixel driving circuits 112 respectively coupled to the other first light-emitting devices 110 each are disposed on a lower side of a respective first light-emitting device 110 in the first display area 11.

Since the first light-emitting device 110 with the light-emitting color of green (G) disposed in the first display area 11 needs to be coupled to the pixel driving circuit 112 disposed in the second display area 12, the first light-emitting device 110 is coupled to the pixel driving circuit 112 by the first metal layer 1123. For example, referring to FIG. 8, a plurality of electrodes 1123' are formed in the first metal layer 1123. An end of the electrode 1123' is located in the first display area 11. Then, other film layers of the pixel driving circuit 112 located on the first metal layer 1123 are sequentially manufactured in the second display area 12, so that the pixel driving circuit 112 located in the second display area 12 is coupled to the first light-emitting device 110 located in the first display area 11.

In some embodiments, referring to FIG. 1A, the display panel 1 further includes a first drive module 31 and a second drive module 32. The first drive module 31 is configured to provide a driving signal to the first driving circuit 111, and the second drive module 32 is configured to provide a driving signal to the second driving circuit 121.

For example, the first drive module 31 provides, for example, the first data signal Data" and the power supply voltage signal VDD", to the first driving circuit 111. The second driving circuit 32 provides, for example, the second data signal SEG to the second driving circuit 121.

For another example, the first drive module 31 includes, for example, a first driver chip 310 configured to provide the first data signal Data" to the first driving circuit 111.

The second drive module 32 includes, for example, a second driver chip 320 configured to provide the second data signal SEG to the second driving circuit 121.

Based on the above, the first driver chip 310 and the second driver chip 320 are, for example, source drivers.

Since the drive modes of the first driving circuit 111 and the second driving circuit 121 are different, the first drive module 31 is arranged to provide various signals required by the first driving circuit 111, and the second drive module 32 is arranged to provide various signals required by the second driving circuit 121, so as to ensure the normal operation of the first driving circuit 111 and the second driving circuit 121.

It will be understood by those skilled in the art that the display unit is only a minimum repeating unit, and may not necessarily be understood as a pixel. For example, since the first light-emitting device 110 may be shared by two adjacent first display units 115, a single first display unit 115 cannot be understood as a pixel, and the second display unit 116 and the third display unit may be understood as pixels.

The foregoing descriptions are only specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel having a first display area and a second display area that are adjacent to each other; the display panel comprising:
  a substrate;
  a plurality of first light-emitting devices disposed on the substrate and located in the first display area;
  a first driving circuit disposed on the substrate and coupled to the plurality of first light-emitting devices; wherein the first driving circuit is configured to actively drive the plurality of first light-emitting devices to emit light; the first driving circuit includes a plurality of pixel driving circuits and a signal line; the signal line is located in the second display area, and extends substantially along an edge of the second display area proximate to the first display area; and the signal line is coupled to pixel driving circuits located on two opposite sides of the second display area, and an orthographic projection of the signal line on the substrate and an orthogonal projection of the first display area on the substrate have a gap therebetween;
  a plurality of second light-emitting devices disposed on the substrate and located in the second display area; and
  a second driving circuit disposed on the substrate and coupled to the plurality of second light-emitting devices; wherein the second driving circuit is configured to passively drive the plurality of second light-emitting devices to emit light; wherein
  an orthographic projection of at least one of the plurality of second light-emitting devices on the substrate is overlapped with an orthogonal projection of the gap on the substrate;
  wherein the first driving circuit further includes scan signal lines configured to provide scan signals to the plurality of pixel driving circuits, and the scan signal lines extend along a first direction; the first direction is a direction along which the two opposite sides of the second display area are distributed.

2. The display panel according to claim 1, wherein the first display area includes a first sub-area and two second sub-areas arranged opposite to each other along the first direction, and the second sub-areas are located between the first sub-area and the second display area; a length of a second sub-area is substantially equal to a length of the second display area; a length direction of the second sub-area is a second direction, and the second direction is perpendicular to the first direction; and
  along the first direction, a minimum distance between any two first light-emitting devices located in the first sub-area is less than a minimum distance between any two first light-emitting devices located in the second sub-area.

3. The display panel according to claim 2, wherein along the first direction, first light-emitting devices located in the first sub-area are arranged at equal distances, and distances each of which is a distance between adjacent first light-emitting devices located in the second sub-area are increased in sequence.

4. The display panel according to claim 1, wherein an orthographic projection, on the substrate, of a pixel driving circuit in the plurality of pixel driving circuits that is coupled to a first light-emitting device proximate to the second display area is overlapped with the orthogonal projection of the gap on the substrate.

5. The display panel according to claim 4, wherein in the first display area, the plurality of first light-emitting devices constitute a plurality of first display units and a plurality of second display units, and the plurality of second display units are closer to the second display area than the plurality of first display units; a first display unit and a second display unit each include first light-emitting devices with light-emitting colors of three primary colors, wherein a light-emitting color of each first light-emitting device is one of the three primary colors; and the first display unit includes four first light-emitting devices, and the second display unit includes three first light-emitting devices.

6. The display panel according to claim 5, wherein at least one orthographic projection, on the substrate, of at least one pixel driving circuit respectively coupled to at least one first light-emitting device in the second display unit is overlapped with the orthogonal projection of the gap on the substrate.

7. The display panel according to claim 6, wherein an orthographic projection, on the substrate, of a first light-emitting device in the at least one first light-emitting device that is coupled to a pixel driving circuit in the at least one pixel driving circuit, whose orthographic projection on the substrate is overlapped with the orthogonal projection of the gap on the substrate, is non-overlapped with the orthographic projection of this pixel driving circuit on the substrate.

8. The display panel according to claim 6, wherein in the second display area, the plurality of second light-emitting devices constitute a plurality of third display units each including second light-emitting devices with light-emitting colors of the three primary colors; wherein a light-emitting color of each second light-emitting device is one of the three primary colors, and a number of the second light-emitting devices included in each third display unit is equal to a number of the first light-emitting devices included in the second display unit.

9. The display panel according to claim 5, wherein in the second display area, the plurality of second light-emitting devices constitute a plurality of third display units each including second light-emitting devices with light-emitting colors of the three primary colors; wherein a light-emitting color of each second light-emitting device is one of the three primary colors, and a number of the second light-emitting devices included in each third display unit is equal to a number of the first light-emitting devices included in the second display unit.

10. The display panel according to claim 9, wherein the first light-emitting device includes a first electrode and a second electrode arranged opposite to each other, and second electrodes in the plurality of first light-emitting devices are of an integrative structure;
the second light-emitting device includes a third electrode and a fourth electrode arranged opposite to each other, and fourth electrodes in second light-emitting devices in a same column of third display units are of an integrative structure;
the first electrode and the third electrode are arranged in a same layer, and are made of a same material; and the second electrode and the fourth electrode are arranged in a same layer, and are made of a same material.

11. The display panel according to claim 10, further comprising a plurality of separating structures disposed in the second display area; wherein the separating structures are configured to separate a second electrode and a fourth electrode that are adjacent to each other, and to separate two adjacent fourth electrodes.

12. The display panel according to claim 11, wherein a separating structure in the plurality of separating structures is a separating pillar or a separating groove.

13. The display panel according to claim 12, wherein in a longitudinal section of the separating pillar or the separating groove, a length of a bottom edge is less than a length of a top edge; wherein the longitudinal section is taken along the direction from the first display area to the second display area.

14. The display panel according to claim 11, an orthographic projection, on the substrate, of a separating structure configured to separate the second electrode and the fourth electrode that are adjacent to each other is overlapped with the orthogonal projection of the gap on the substrate.

15. The display panel according to claim 14, wherein at least one orthographic projection, on the substrate, of at least one pixel driving circuit respectively coupled to at least one first light-emitting device in the second display unit is overlapped with the orthogonal projection of the gap on the substrate; and
the separating structure includes a plurality of protrusion each protruding along a direction from the first display area to the second display area.

16. The display panel according to claim 1, wherein a minimum distance between any adjacent first light-emitting device and second light-emitting device is less than or equal to 60 μm.

17. The display panel according to claim 1, wherein the first driving circuit further includes initialization signal lines, and the signal line is connected to initialization signal lines located on the two opposite sides of the second display area; and the two opposite sides of the second display area are two opposite sides distributed along an extending direction of the initialization signal lines.

18. The display panel according to claim 1, further comprising a first drive module and a second drive module, wherein the first drive module is configured to provide a driving signal to the first driving circuit, and the second drive module is configured to provide another driving signal to the second driving circuit.

19. A display device, comprising the display panel according to claim 1.

* * * * *

UNITED STATES PATENT AND TRADEMARK OFFICE
CERTIFICATE OF CORRECTION

PATENT NO. : 11,818,935 B2
APPLICATION NO. : 17/800923
DATED : November 14, 2023
INVENTOR(S) : Ling Shi et al.

It is certified that error appears in the above-identified patent and that said Letters Patent is hereby corrected as shown below:

In the Specification

In Column 7, Line 41, please change "FIG.10" to --FIG.1C--.
In Column 7, Line 59, please change "FIG.10" to --FIG.1C--.
In Column 25, Line 25, please change "FIG.10" to --FIG.1C--.

Signed and Sealed this
Second Day of January, 2024

Katherine Kelly Vidal
*Director of the United States Patent and Trademark Office*